(12) United States Patent
Bozovic et al.

(10) Patent No.: US 8,204,564 B2
(45) Date of Patent: Jun. 19, 2012

(54) HIGH TEMPERATURE INTERFACIAL SUPERCONDUCTIVITY

(75) Inventors: Ivan Bozovic, Mount Sinai, NY (US); Gennady Logvenov, Port Jefferson Station, NY (US); Adrian Mihai Gozar, Port Jefferson, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 866 days.

(21) Appl. No.: 12/264,742

(22) Filed: Nov. 4, 2008

(65) Prior Publication Data

US 2009/0137398 A1 May 28, 2009

Related U.S. Application Data

(60) Provisional application No. 60/986,186, filed on Nov. 7, 2007.

(51) Int. Cl.
*H01L 39/24* (2006.01)
(52) U.S. Cl. .................................. 505/220; 505/236
(58) Field of Classification Search .................. 505/220, 505/236
See application file for complete search history.

(56) References Cited

U.S. PATENT DOCUMENTS

| | | |
|---|---|---|
| 4,837,609 A | 6/1989 | Gurvitch et al. |
| 5,106,823 A | 4/1992 | Creuzet et al. |
| 5,138,401 A | 8/1992 | Yamazaki |
| 5,171,732 A | 12/1992 | Hed |
| 5,240,906 A | 8/1993 | Bednorz et al. |
| 5,304,538 A | 4/1994 | Vasquez et al. |
| 5,326,988 A | 7/1994 | Ishida |
| 5,378,683 A | 1/1995 | Cabanel et al. |
| 5,380,704 A | 1/1995 | Tarutani et al. |
| 5,382,565 A | 1/1995 | Bednorz et al. |
| 5,399,881 A | 3/1995 | Bozovic et al. |
| 5,422,336 A | 6/1995 | Tsuda et al. |
| 5,455,451 A | 10/1995 | Usagawa et al. |
| 5,458,086 A | 10/1995 | Smith et al. |
| 5,629,267 A | 5/1997 | Ikegawa et al. |
| 5,663,081 A | 9/1997 | Sung et al. |
| 5,686,745 A | 11/1997 | Lin et al. |
| 5,717,222 A | 2/1998 | Nakamura et al. |
| 6,111,268 A | 8/2000 | Mannhart et al. |
| 6,365,913 B1 | 4/2002 | Misewich et al. |
| 6,518,648 B1 | 2/2003 | Lopatin |
| 6,649,929 B2 | 11/2003 | Newns et al. |
| 6,794,339 B2 | 9/2004 | Wiesmann et al. |
| 6,999,806 B2 | 2/2006 | Adachi et al. |

OTHER PUBLICATIONS

Ahn, C. H. et al., "Electric field effect in correlated oxide systems," Nature, 424, 1015-1018 (2003).
Ahn, C.H., "Electrostatic modulation of superconductivity in ultrathin GdBa$_2$Cu$_3$O$_{7-\delta}$." Science 284, 1152-1155 (1999).
Wang, H. H., et al., "Synthesis, structure, and superconductivity of single crystals of high-T$_c$ La$_{1.85}$Sr$_{0.15}$CuO$_4$," Inorg. Chem. 26, 1190-1192 (1987).
Ando, Y., et al., "Mobility of the Doped Holes and the Antiferromagnetic Correlations in Underdoped High-T$_c$ Cuprates," Phys. Rev. Lett. 87, 017001 (2001).
Berezinskii, V.L., "Destruction of long-range order in one-dimensional and 2-dimensional systems having a continuous symmetry group 1. Classical systems," Soviet Physics JETP-USSR 32 493 (1971).
Berezinskii, V.L., "Destruction of long-range order in one-dimensional and 2-dimensional systems having a continuous symmetry group 2. Quantum systems," Soviet Physics JETP-USSR 34, 610 (1972).
Bozovic, I., "About Physics, Myself, and Ginzburgs," Journal of Superconductivity and Novel Magnetism, vol. 19, Nos. 3-5, (Jul. 2006).
Bozovic, I., "Atomic-Layer Engineering of Superconducting Oxides: Yesterday, Today, Tomorrow," IEEE Trans. Appl. Supercond. 11, 2686-2695 (2001).
Bozovic, I., et al., "Superconducting oxide multilayers and superlattices: physics, chemistry and nanoengineering," Physica C 235-240, 178-181 (1994).
Bozovic, I., et al., "Epitaxial Strain and Superconductivity La$_{2-x}$Sr$_x$CuO$_4$ Thin Films," Phys. Rev. Lett. 89, 107001 (2002).
Bozovic, I., "Experiments With Atomically Smooth Thin Films of Cuprate Superconductors: Strong Electron-Phonon Coupling and Other Surprises," Russian Physics Uspekhi 178, 170 (2008).
Bozovic, I., et al., "No mixing of superconductivity and antiferromagnetism in a high temperature superconductor," Nature 422, 873-875 (2003).
Chen, C.Y., et al., "Frequency and Magnetic-Field Dependence of the Dielectic Constant and Conductivity of La$_2$CuO$_{4+\delta}$," Phys. Rev. B 43, 392-401 (1991).
Cheong, S.W., et al. "Properties of La$_2$CuO$_4$ and related compounds", Physica C 158, 109-126 (1989).

(Continued)

*Primary Examiner* — Edward Cain
(74) *Attorney, Agent, or Firm* — Dorene M. Price

(57) ABSTRACT

High-temperature superconductivity confined to nanometer-scale interfaces has been a long standing goal because of potential applications in electronic devices. The spontaneous formation of a superconducting interface in bilayers consisting of an insulator (La$_2$CuO$_4$) and a metal (La$_{1-x}$Sr$_x$CuO$_4$), neither of which is superconducting per se, is described. Depending upon the layering sequence of the bilayers, T$_c$ may be either ~15 K or ~30 K. This highly robust phenomenon is confined to within 2-3 nm around the interface. After exposing the bilayer to ozone, T$_c$ exceeds 50 K and this enhanced superconductivity is also shown to originate from a 1 to 2 unit cell thick interfacial layer. The results demonstrate that engineering artificial heterostructures provides a novel, unconventional way to fabricate stable, quasi two-dimensional high T$_c$ phases and to significantly enhance superconducting properties in other superconductors. The superconducting interface may be implemented, for example, in SIS tunnel junctions or a SuFET.

37 Claims, 10 Drawing Sheets

OTHER PUBLICATIONS

Clem, J.R., "Vortex Dynamics in a Type II Superconducting Film and Complex Linear-Response Functions," Phys. Rev. B 46, 14662 (1992).

Fogel, N. Y., et al., "Interfacial superconductivity in semiconducting monochalcogenide superlattices," Phys. Rev. B 66, 174513 (2002).

Fogel, N. Y., et al., "Single-interface superconductivity in two-layer semiconductor heterostructures," preprinted at arXiv:cond-mat/0404476v2 [cond-mat.supr-con] Nov. 14, 2005.

Fujita, K., et al., "Effect of Disorder Outside the $CuO_2$ Planes of Copper Oxide Superconductors," Phys. Rev. Lett. 95, 097006 (2005).

Gabovich, A.M., et al., "Thermodynamic properties of superconducting ceramics $BaPb_{1-x}Bi_xO_3$," J. Phys. C: Solid State Phys., 15, L569-572 (1982).

Ginsburg, V.L., "On interface superconductivity," Phys. Lett. 13, 101 (1964).

Gozar, A., et al., "Surface Structural Analysis of Atomically Smooth $BaBiO_3$ films," Phys. Rev. B 75, R201402 (2007).

Gozar, A., et al., "High-temperature interface superconductivity between metallic and insulating cuprates," Nature, 455, 7214, 707-734 (2008).

Hamann, D.R., et al., "Lattice-polarization effects on electron-gas charge densities in ionic superlattices," Phys. Rev. B. 73, 195403 (2006).

Harrison, W.A., et al., "Polar heterojunction interfaces," Phys. Rev. B. 18, 4402-4410 (1978).

He, Jiaqing, et al., "Microstructure and possible strain relaxation mechanisms of $La_2CuO_{4+\delta}$ thin films grown on $LaSrAlO_4$ and $SrTiO_3$ substrates," J. App. Phys. 101, 073906 (2007).

Hidaka, Y., et al., "Anisotropic properties of superconducting single-crystal $(La_{1-x}Sr_x)_2CuO_4$", Jpn. J. Appl. Phys. pt. 2 vol. 26, L377-L379 (1987).

Hwang, H.Y., et al., "High mobility electrons in $SrTiO_3$ heterostructures," Physica E 22, 712-716 (2004).

Ino, A., et al., "Chemical potential shift in overdoped and underdoped $La_{2-x}Sr_xCuO_4$," Phys. Rev. Lett. 79, 2101-2104 (1997).

Iwazumi, T., et al., "Preparation and property of $La_{1.85}Sr_{0.15}CuO_4$ single crystal", Jpn. J. Appl. Phys. pt. 2 vol. 26, L386-L387 (1987).

Jorgensen, J. D., et al., "Superconducting phase of $La_2CuO_{4+\delta}$: A superconducting composition resulting from phase separation," Phys. Rev. B 38, 11337-11345 (1988).

Kastner, M.A., et al., "Magnetic, transport and optical properties of monolayer copper oxides," Rev. Mod. Phys. 70, 897-928 (1998).

Kilvelson, S.A., et al., "Making high $T_c$ higher: a theoretical proposal," Physica B 318, 61-67 (2002).

Komiya, S., et al., "c-axis transport and resistivity anisotropy of lightly to moderately doped $La_{2-x}Sr_xCuO_4$ single crystals: Implications on charge transport mechanism," Phys. Rev. B 65, 214535 (2002).

Kosterlitz, J.M., et al., "Ordering, metastability and phase-transitions in 2 dimensional systems," Journal of Physics C-Solid State Physics 6, 1181-1203 (1973).

Laughlin, R., "Nobel Lecture: Fractional Quantization," Rev. Mod. Phys. 71, 863-874 (1999).

Li Z.Z., et al., "Synthesis of $Bi_2Sr_2CaCu_2O_8/Bi_2Sr_2CuO_6$ superlattices with a $T_c$ enhancement effect," Phys. Rev. Lett. 72, 4033-4036 (1994).

Liverman, W.J., et al., Superconductivity under pressure of $La_{2-x}Ba_xCuO_4$ ($0.05 \leq x \leq 0.25$) and $Nd_{1.85}Ce_{0.15}CuO_{4-\delta}$. Phys. Rev. B. 45, 4897-4900 (1992).

Locquet, J.P., et al., "Doubling the Critical Temperature of $La_{1.9}Sr_{0.1}CuO_4$ Using Expitaxial Strain," Nature 394, 453 (1998).

Logvenov, G. et al., "Artificial Superlattices Grown by MBE: Could We Design Novel Superconductors?," Physica C 468, 100 (2008).

Logvenov, G. et al., "Combinatorial molecular beam epitaxy of $La_{2-x}Sr_xCuO_{4+\delta}$," Physica C 460-462, 416-419 (2007).

Logvenov, G. et al., "Engineering interfaces in cuprate superconductors," Physica B 403 1149-1150 (2008).

Nakagawa, N., et al., "Why some interfaces cannot be sharp," Nature Materials 5, 204-209 (2006).

Ohtomo, A., et al. Artificial charge-modulation in atomic-scale perovskite titanate superlattices. Nature 419, 378-380 (2002).

Ohtomo, A., et al., "A high-mobility electron gas at the $LaAlO_3/SrTiO_3$ heterointerface," Nature 427, 423-426 (2004).

Okamoto, S., et al., Lattice relaxation in oxide heterostructures: $LaTiO_3/SrTiO_3$ superlattices. Phys. Rev. Lett. 97, 056802 (2006).

Pajaczkowska, A., et al., "Czochralski Growth of $SrLaAlO_4$ and $SrLaAlO_4$ single crystals and its implications for the crystal morphology," Journal of Crystal Growth 171, 387-391 (1997).

Pickett, W. E., "Electronic structure of the high-temperature oxide superconductors", Rev. Mod. Phys. 61, 433-512 (1989).

Radaelli, P. G., et al., "Structural and superconducting properties of $La_{2-x}Sr_xCuO_4$ as a function of Sr content," Physical Review B 49, 4163-4175 (1994).

Radovic, Z., et al, "Photoinduced expansion of cuprate superconductors: Evidence of strong electron-lattice coupling," Phys. Rev. B 77, 092508 (2008).

Reyren, N., et al., "Superconducting Interfaces Between Insulating Oxides," Science 317, 1196-1199 (Aug. 2007).

Sachdev, S., "Order and quantum phase transitions in the cuprate superconductors," Rev. Mod. Phys. 75, 913-932 (2003).

Sato, H. et al., "$La_{2-x}Sr_xCuO_y$ Expitaxial Thin Films (x=0 to 2): Structure, Strain, and Superconductivity," Phys. Rev. B 61, 12447-12456 (2000).

Seguchi, Y., et al., "Magnetic-Field-Enhanced Superconductivity in Au/Ge Layered Films," Journal of the Physical Society of Japan, vol. 61, No. 6, Jun. 1992, 1875-1878.

Siemons, W., et al., "Origin of charge density at $LaAlO_3$ on $SrTiO_3$ heterointerfaces: possibility of intrinsic doping," Phys. Rev. Lett. 98, 196802 (2007).

Smadici, S., et al., "Hole Delocalization in Superconducting $La_2CuO_4$—$La_{1.64}Sr_{0.36}CuO_4$ Superlattices," (preprint at http://xxx.lanl.gov/abs/0805.3189).

Uchida, S., "Physical properties of high $T_c$ oxides", Int. J. Mod. Phys. B 2, 181-190 (1988).

Yaguchi, H., et al., "Interface superconductivity in the eutectic $Sr_2RuO_4$-Ru: 3-K phase of $Sr_2RuO_4$," Phys. Rev. B 67, 214519 (2003).

Yamada, K., et al., "Doping dependence of the spatially modulated dynamical spin correlations and the superconducting-transition temperature in $La_{2-x}Sr_xCuO_4$," Phys. Rev. B 57, 6165 (1998).

Fig. 3A
Fig. 3B
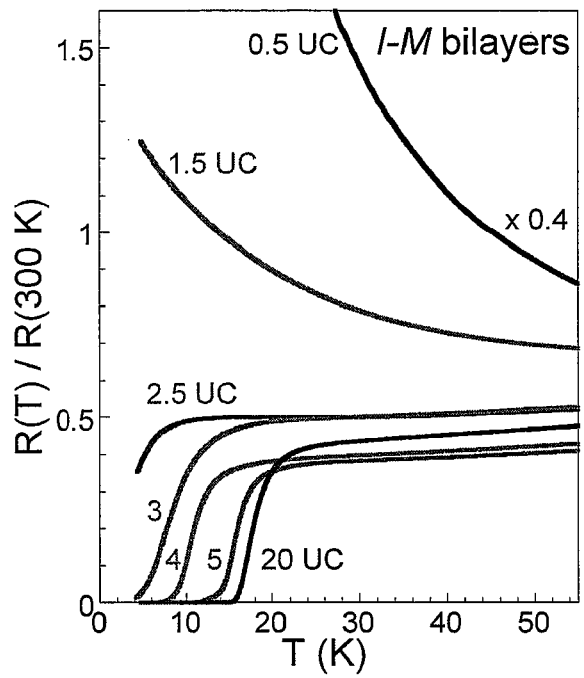
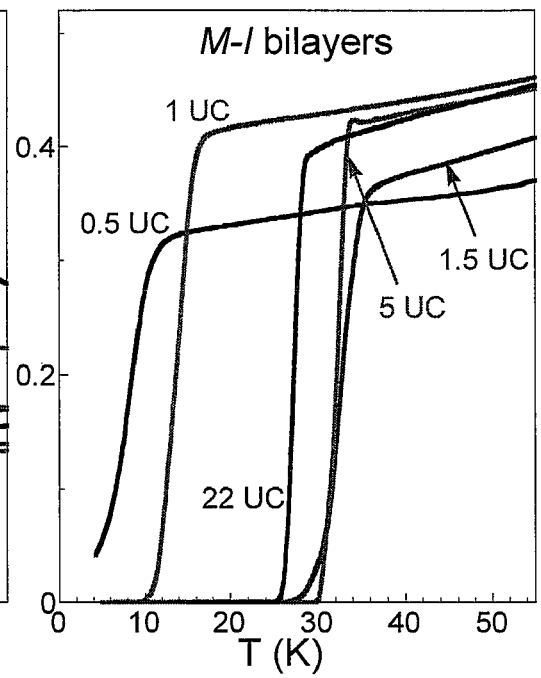
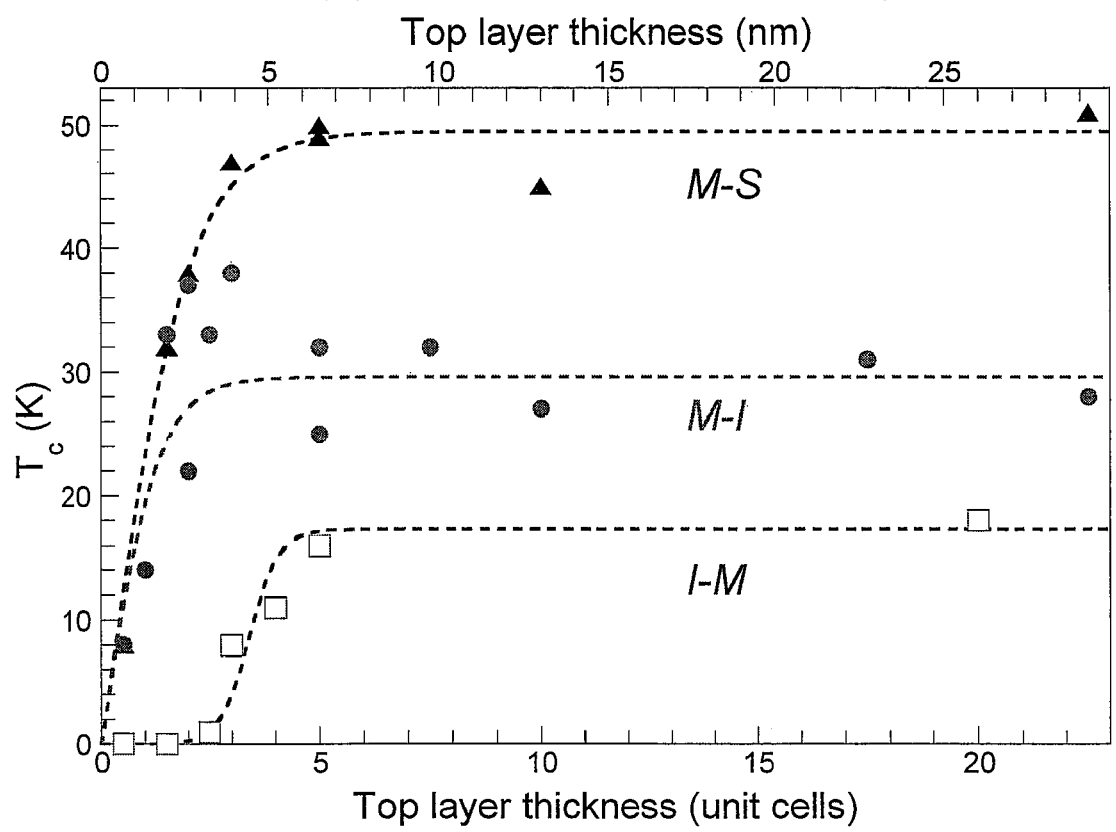
Fig. 3C

Fig. 4A
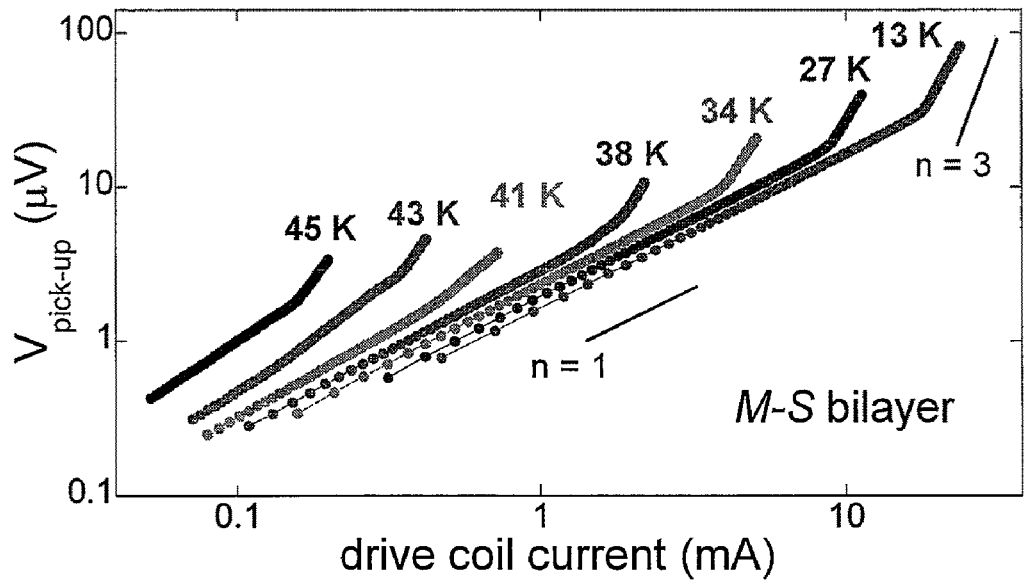
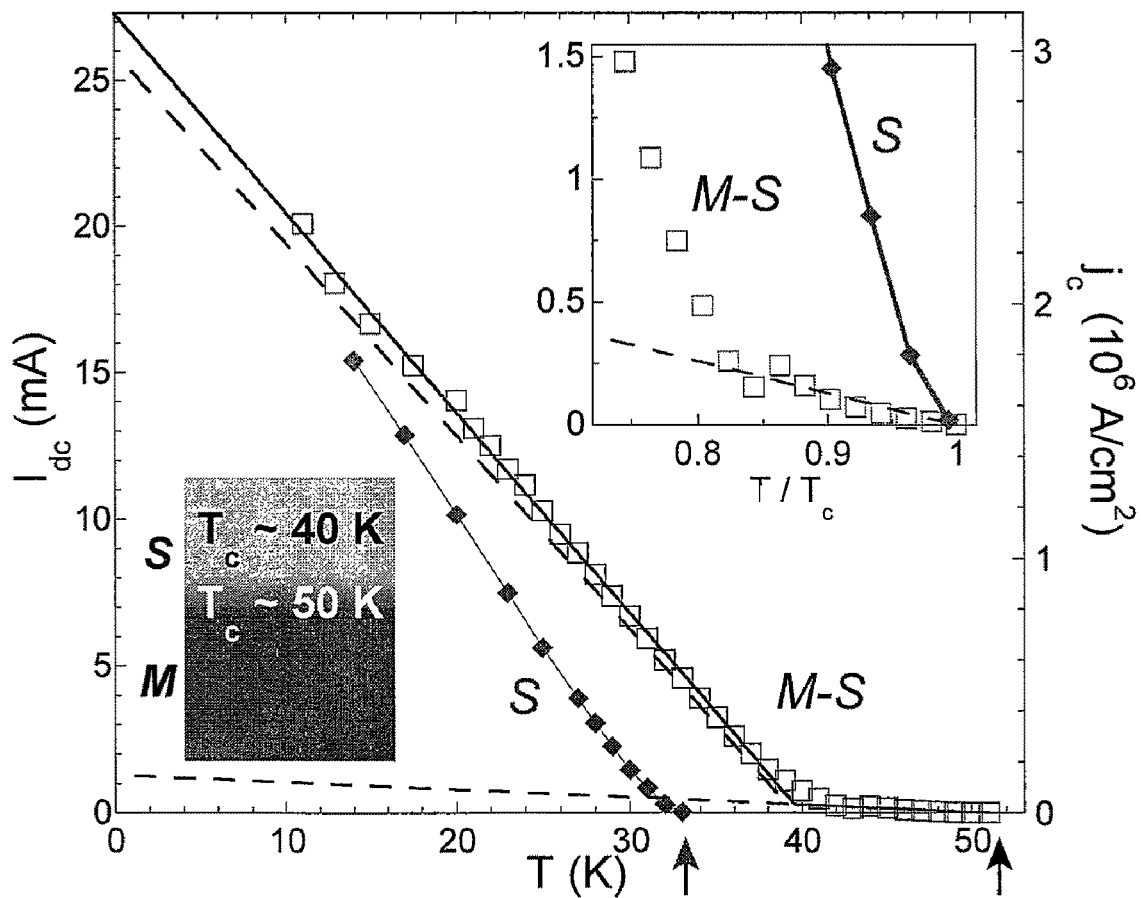
Fig. 4B

HIGH TEMPERATURE INTERFACIAL SUPERCONDUCTIVITY

CROSS-REFERENCE TO RELATED APPLICATIONS

This application claims priority to U.S. Provisional Patent Application No. 60/986,186 filed on Nov. 7, 2007 under 35 U.S.C. §119(e), the entirety of which is incorporated by reference as if fully set forth in this specification.

STATEMENT OF GOVERNMENT LICENSE RIGHTS

The present invention was made with government support under contract number DE-AC02-98CH10886 awarded by the U.S. Department of Energy. The United States government has certain rights in the invention.

BACKGROUND OF THE INVENTION

I. Field of the Invention

This invention relates generally to interfacial superconductivity. In particular, the present invention relates to the formation of an ultrathin and stable superconducting layer at the interface between two materials. This invention further relates to the utilization of such a superconducting interface in electronic devices.

II. Background of the Related Art

The discovery of a class of copper-oxide ceramics or cuprates in 1986 which exhibit superconductivity with transition temperatures ($T_c$) higher than the boiling point of liquid nitrogen (77 K) resulted in renewed interest in layered superconductors. These so-called high-temperature superconductors (HTS) possess a crystal structure which is intrinsically multi-layered; metallic $CuO_2$ layers are stacked in an alternating sequence with insulating metal oxide layers. In the cuprates, the metal oxide layers are generally regarded as charge-reservoir blocks which provide mobile charges to the $CuO_2$ layers. Some examples of typical native metal oxide-$CuO_2$ superlattices include structures comprising Y and BaO layers in $YBa_2Cu_3O_7$ (YBCO), $Bi_2Sr_2O_4$ layers in $Bi_2Sr_2CuO_6$ (Bi-2201), and $(La, Sr)_2O_2$ layers in $La_{2-x}Sr_xCuO_4$ (LSCO). An introductory review of high-temperature superconductors is provided, for example, by M. Cyrot and D. Pavuna in "*Introduction to Superconductivity and High-$T_c$ Materials*," World Scientific, NJ (1991) the entire contents of which is incorporated by reference.

The realization that superconducting cuprates are comprised of layered crystal structures led to an interest in synthesizing artificial HTS and related complex oxides by atomic-layer engineering (ALE). The development and utilization of ALE is described, for example, by I. Bozovic (hereinafter "Bozovic") in "*Atomic-Layer Engineering of Superconducting Oxides: Yesterday, Today, Tomorrow*," IEEE Trans. Appl. Supercond. 11, 2686 (2001) which, along with the references cited therein, is incorporated by reference as if fully set forth in this specification. In general, ALE is defined as the controlled deposition of sequential thin films of different materials with thicknesses which may span only a few atomic layers. Growth is switched between materials with atomic-level control on the order of a few percent of an atomic monolayer (ML) or better.

Growth of HTS and related oxides has been accomplished predominantly by shuttered molecular beam epitaxy (MBE) although a variety of other techniques such as sputtering and pulsed laser deposition (PLD) have also been used to deposit high-quality superconducting layers. During MBE, a number of elemental sources containing the desired constituents (e.g., La, Sr, Cu, etc.) are situated within a vacuum chamber. The sources are each heated by means of separate effusion cells or e-beam guns to produce and direct the desired flux of atoms onto a substrate. The absolute rate of deposition of each element is accurately controlled and individual atomic beams may be turned on or off at precise intervals by the removal or insertion of a mechanical shutter. The surface chemistry of the deposited film can then be controlled by varying the shuttering sequence which may include concurrent deposition of two or more elements for specified time periods.

A variety of approaches which employ ALE have been followed in attempting to fabricate novel superconducting materials and interfaces. These include, for example, varying the crystallographic structure and orientation of the underlying substrate and controlling the growth kinetics by varying the shuttering intervals and sequence as well as the growth temperature. ALE has been used to successfully fabricate single-crystal, defect-free films of LSCO, YBCO, Bi-2201, $Bi_2Sr_2CaCu_2O_8$ (Bi-2212) as well as Bi-2201/Bi-2212 and $YBCO/PrBa_2Cu_3O_7$ superlattices. Some of the first artificial HTS compounds of $Bi_2Sr_2Ca_7Cu_8O_{20}$ and $(BaCuO_2)_2(SrCuO_2)_n$ have also been produced by ALE.

The realization of zero electrical resistance and perfect diamagnetism makes HTS-based electronic devices especially attractive. As a result, considerable research effort has been directed toward the development of electronic devices capable of exploiting the advantages inherent to superconducting materials. Despite advances in the ALE of HTS, the development of commercially viable electronic devices and integrated circuits which utilize HTS materials has been met with limited success. Many of these devices have been based on the Josephson effect which pertains to current flow between two superconductors which are separated by a very thin insulating barrier in the absence of an applied voltage. Such a structure is known as a Josephson junction (JJ) and has formed the basis for high-speed switching elements and ultrasensitive detectors. The formation of HTS JJs is described, for example, in U.S. Pat. No. 6,999,806 to Adachi, et al. which is incorporated by reference as if fully set forth in this specification.

A variety of electronic devices which incorporate superconducting materials in different forms have been developed. These include, for example, novel semiconductor-superconductor hybrid devices (U.S. Pat. Nos. 5,138,401; 5,326,988; and 5,455,451), superconducting field-effect transistors (SuFET; U.S. Pat. Nos. 5,240,906; 5,382,565; and 5,663,081), Josephson field-effect transistors (JoFET; U.S. Pat. No. 6,111,268), as well as superconductor-insulator-superconductor (SIS) and superconductor-normal metal-superconductor (SNS) tunnel junctions (U.S. Pat. Nos. 5,304,538; 6,999,806). Each of the aforementioned patents along with the references cited therein are incorporated by reference as if fully set forth in this specification. Although HTS-based electronic devices show great promise with the potential to realize very high switching speeds with minimal power consumption and negligible thermal losses, actual fabrication of such devices requires solutions to a number of challenging materials-related problems. A review of some of these issues is provided, for example, by C. H. Ahn, et al. in "*Electric field effect in correlated oxide systems*," Nature, 424, 1015 (2003) which is hereby incorporated by reference.

Successful fabrication of HTS electronics requires the ability to deposit ultrathin, uniform superconducting layers which are structurally perfect, free of pinholes or other defects, and have atomically smooth surfaces and interfaces.

These requirements pose conflicting challenges for the ALE of HTS materials. High growth temperatures are generally required to ensure excellent crystallinity; however, higher temperatures may also lead to surface roughening and enhanced interdiffusion at film interfaces. The ability to deposit ultrathin (on the order of a few nm) layers of HTS materials with the desired stoichiometry, crystal structure, and layering sequence requires precise atomic-level control of the impinging flux during film growth. Thus far, it has proved very difficult to achieve bulk $T_c$ values in very thin HTS films; the transitions are typically broad and the $T_c$ is low. Another problem encountered with ultrathin HTS materials is that subsequent processing steps necessary to fabricate actual electronic devices tend to degrade the material quality.

Additional materials challenges which have hindered the development of HTS layers include improvements in film quality and reproducibility over large areas and between different deposition sequences, but under identical deposition conditions. In addition to the problems associated with fabrication of suitable HTS materials, there is a continuing and ever-present need to produce superconductors with still higher $T_c$. Present-day HTS devices require cooling to cryogenic temperatures in order to transit to the superconducting state. The realization of materials which superconduct at room temperature and above remains a long-standing goal of present-day materials scientists and would significantly increase the range of practical applications for this class of materials.

SUMMARY OF THE INVENTION

In view of the above-described problems and goals, it is an objective of the present invention to provide uniform, ultrathin, and stable superconducting interfacial layers with heightened superconducting transition temperatures. In one embodiment, interfacial superconductivity occurs due to charge depletion and accumulation across an interface between two materials which may not themselves be superconducting due to differences in the chemical potential of the two layers forming the superconducting interface. This may be accomplished, for example, by sequentially depositing a thin layer of an electrically conducting material (M) and an electrically insulating material (I), both of which are not themselves superconducting. The deposition process is controlled with atomic-level precision such that the transition between successive M-I layers is atomically abrupt. The interface between the two materials exhibits superconducting behavior, irrespective of the order (M-I or I-M) in which they are deposited. The superconductivity originates from and is confined to a few unit cells surrounding the interface, being preferably confined to $\leq 2$ unit cells. The M and I layers are preferably $\geq 5$ unit cells thick, but are not so limited. The form of M and I is not limited to thin layers, but may be any form, shape, or structure which permits a superconducting interface to be formed between them.

In another embodiment a plurality of superconducting interfacial layers are formed from a superlattice of M and I layers. The superlattice comprises M-I layers which are sequentially stacked to form a structure comprised, for example, of M-I-M-I . . . M-I-M-I layers. The interface between each layer is atomically abrupt and the surface is atomically smooth. The thickness of each M and I layer may be set to any predetermined value, but is generally at least one unit cell. Individual M and I layers may have identical thicknesses throughout the entire superlattice or may have any combination of different thicknesses. The total number of M and I layers may be arbitrarily defined to suit a particular application, being an odd or even number with the beginning and terminating layers independently being either M or I.

In yet another embodiment the interfacial superconducting layer is formed between two cuprate layers, one of which behaves as an electrical insulator and the other as an electrical conductor. The cuprate has a crystal structure comprised of layers of $CuO_2$ which are stacked in an alternating sequence with at least one other metal oxide layer. A plurality of different metals may be used to form the metal oxide layers. The insulator may be undoped or underdoped whereas the conductor is heavily doped and exhibits metallic behavior. The material used as the dopant is preferably a transition metal, but is not so limited. The metallic cuprate layer is preferably deposited first followed by an insulating cuprate layer, but the insulating cuprate layer may also be deposited first. The superconducting interface may also be formed between a metallic or insulating cuprate and another insulating or metallic material which is not a cuprate. The superconducting interfacial layer forms as a result of intrinsic polarization of the interface between the two materials due to their differing chemical potentials.

In a preferred embodiment the superconducting interfacial layer is formed between an underdoped insulating $La_{2-x}Sr_xCuO_4$ (LSCO) film and a highly overdoped electrically conducting metallic LSCO layer which are sequentially deposited as thin films onto a substrate. The metallic LSCO layer has a Sr concentration x which is preferably $x>0.25$. The insulating LSCO layer preferably has a Sr concentration of $x<0.06$ and, in an even more preferred embodiment, is undoped $La_2CuO_4$ (LCO). The films are preferably $\geq 5$ UCs thick, but are not so limited. A superconducting interfacial layer is formed between the layers regardless of the deposition order. The superconducting interface preferably has $T_c>30$ K. The substrate is preferably $LaSrAlO_4$ (LSAO), but may be $SrTiO_3$ (STO), $LaAlO_3$ (LAO), $(La_{0.29}, Sr_{0.71})(Al_{0.65}, Ta_{0.35})O_3$ (LSAT) or any other of a plurality of suitable substrates. In an especially preferred embodiment an initial metallic LSCO layer is deposited onto LSAO followed by deposition of a LCO layer.

In still another embodiment an interfacial layer is formed between an electrical conductor (M) and a superconducting layer (S). By sequentially depositing M and S layers, the formation of an M-S interface results in an increase in the superconducting temperature $T_c$ of S. The increase in $T_c$ is observed regardless of the order in which the M and S layers are deposited (e.g., M-S or S-M) and is confined to a layer located within a few unit cells surrounding the M-S interface. The terminating M or S layer is preferably at least two unit cells thick, but is not so limited.

In another embodiment a plurality of superconducting interfacial layers are formed from a superlattice of M and S layers. The superlattice comprises M-S layers which are sequentially stacked to form a structure comprised of, for example, M-S-M-S . . . M-S-M-S layers. The interface between each layer is atomically abrupt and the surface is atomically smooth. The thickness of each layer may be set to any predetermined value, but is generally at least two unit cells. The thickness of individual M and S layers may be identical throughout the entire superlattice or may have any combination of different values. The total number of M and S layers may be arbitrarily defined to suit a particular application, being either an odd or even number with the beginning and terminating layers independently being either M or S.

In yet another embodiment the interfacial superconducting layer is formed between two cuprate layers, one of which behaves as an electrical conductor and the other as a superconductor. The cuprate has a crystal structure comprised of layers of $CuO_2$ which are stacked in an alternating sequence with at least one type of metal oxide layer. A plurality of different metals may be used to form the metal oxide layers. The superconductor may be doped to an optimized concentration whereas the conductor is heavily doped and exhibits metallic behavior. The material used as the dopant is preferably a transition metal, but is not so limited. The superconducting layer may also be formed by doping with excess oxygen.

In a preferred embodiment, a superconducting LSCO layer is formed on an overdoped electrically conducting LSCO layer to produce an interfacial layer with a higher superconducting critical temperature $T_c$. The overdoped LSCO layer behaves as a metal and preferably has a Sr concentration of x>0.25 whereas the superconducting LSCO layer comprises a Sr concentration of $0.06 \leq x \leq 0.25$. The superconducting layer may also be $La_2CuO_{4+\delta}$. An interfacial layer with enhanced $T_c$ is formed between the layers regardless of the deposition order, preferably with $T_c$>50 K. The substrate is preferably LSAO, but may be STO or any other of a plurality of suitable substrates. In an especially preferred embodiment an initial metallic LSCO layer is deposited onto LSAO followed by deposition of a superconducting LSCO layer.

In a further embodiment, a plurality of superconducting interfacial layers are formed from various combinations of M, I, and S layers. The thickness of each layer and the stacking sequence, including the starting and ending layer as well as the order and total number of layers is determined based upon the requirements for the desired application.

Each of the conducting metallic (M), non-conducting insulator (I), and superconducting (S) layers may be formed using any suitable process which provides atomic-level control of the atomic constituents, structure, surface and interfacial roughness, stacking sequence, as well as the thickness of each layer. This includes, but is not limited to deposition techniques such as sputtering, PLD, and MBE. In a preferred embodiment the films are deposited using atomic layer-by-layer MBE (ALL-MBE) in which elemental sources are calibrated to yield predetermined growth rates and deposition onto a substrate is controlled by means of shutters. A prepared substrate is loaded into an evacuated growth chamber and heated to a predetermined deposition temperature. Film growth commences by moving individual shutters such that the substrate is exposed to an atomic beam of one or more sources for predetermined time periods. The growth process is controllable to within a small fraction (e.g., 1%) of a monolayer.

An additional embodiment relates to an electronic device comprising a superconducting interfacial layer which may be a M-I or a M-S layer. The interfacial superconducting layer may be used to form any type of electronic device including two-terminal or three-terminal electronic devices. This includes, but is not limited to utilization as the channel in a SuFET, to form a JJ such as a SNS or SIS junction, as a component in hybrid electronic devices, or as interconnect wiring.

BRIEF DESCRIPTION OF THE DRAWINGS

FIGS. 3A and 3B are plots of R(T) for I-M and M-I bilayers, respectively, with various top layer thicknesses;

FIG. 3C shows $T_c$ as a function of the top layer thickness for I-M, M-I, and M-S bilayer films;

FIG. 4A shows the dependence of the pick-up voltage $V_{pick-up}$ on the current in the drive coil $I_{drive}$ at several temperatures;

FIG. 4B shows data on the temperature dependence of the critical drive coil current $I_{dc}$ for a single-phase S film and M-S bilayer;

DETAILED DESCRIPTION OF THE INVENTION

Figure 1A:
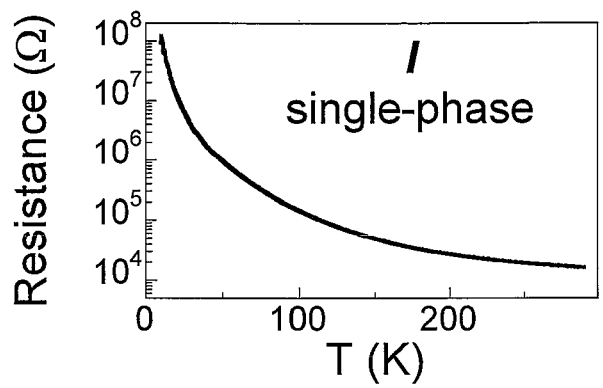
FIGS. 1A-C show the dependence of resistance on temperature for single-phase and bilayer LCO and LSCO films.

The above and other objectives of the invention will become more apparent from the following description and illustrative embodiments which are described in detail with reference to the accompanying drawings. Similar elements in each figure are designated by like reference numbers and, hence, subsequent detailed descriptions thereof may be omitted for brevity. In the interest of clarity, the following terms and acronyms are defined as provided below.

DEFINITIONS

Adatom: An atom located on the surface of an underlying substrate.

Atomically Sharp Generally used to characterize a transition from one material to another. When a transition from one layer to another is atomically sharp, the transition occurs abruptly on an atomic scale. This means that there is no concentration gradient or gradual transition between the two layers. Atomically abrupt is synonymous with atomically sharp.

Bilayer: Two layers of different materials with arbitrary thicknesses which are stacked one on top of the other to form a dual-layer structure.

Cuprates: A compound containing copper and some other element(s), particularly oxygen.

ex situ: The opposite of in-situ. This term is used, in the context of film growth, to mean that a process or analysis is performed outside the growth chamber or reaction vessel, after deposition has completed.

in situ: Latin for "in the place." Within the context of film growth this means that a process or analysis is performed within the growth chamber or reaction vessel. Measurements performed within the ALL-MBE chamber before, during, or after film growth and without breaking vacuum are termed in-situ.

Insulator: A material which resists the flow of electric current. Its electrical conductivity is low such that the flow of current through it is negligible. The resistivity of an insulator gradually increases with decreasing temperature (i.e., dR/dT<0).

Interstitial: An interstitial atom occupies a lattice site which, within the crystal structure of the material, normally is not occupied. An interstitial may also arise when two or more atoms share one or more lattice sites such that the number of atoms is greater than the number of lattice sites.

Metal or Metallic: A material which contains movable electrical charges and, hence, is an electrical conductor. In a metal such as copper or aluminum these charges are electrons. The resistivity of a metal gradually decreases with decreasing temperature (i.e., dR/dT>0), but does not drop to zero.

Monolayer: A single layer of atoms or molecules which occupies all available sites on a surface.

Multilayer: More than one layer of atoms or molecules on the surface with each layer being sequentially stacked on top of the preceding layer.

Polarization: For an atom, the displacement of the center of the negatively charged electron cloud relative to the positive nucleus, which may be induced by an electric field. Polarization may also result from the alignment of permanent electric dipole moments, either intrinsically or in response to an applied electric field.

Submonolayer: Surface atom or molecular coverage which is less than a monolayer.

Superconductivity: The phenomenon in which the electrical resistance of certain materials drops to zero with decreasing temperature.

Superconductor: A material which exhibits superconductivity. The current in a superconductor flows without encountering any resistance and can, in theory, continue indefinitely.

Superlattice: A material with periodically alternating layers of several substances.

$T_c$: The temperature below which the resistivity of a material drops to zero and becomes superconducting.

Unit cell: The basic building block of atoms in a crystalline solid. It is generally defined in terms of atom positions within a parallelepiped volume which may be repeated in three dimensions to form the overall structure of the material.

ACRONYMS

ADF: Annular Dark Field
ALE: Atomic Layer Engineering
ALL-MBE: Atomic Layer-by-Layer MBE
AFM: Atomic Force Microscopy
Bi-1278: $BiSr_2Ca_7Cu_8O_8$
Bi-2201: $Bi_2Sr_2CuO_6$
Bi-2212: $Bi_2Sr_2CaCu_2O_8$
Bi-2213: $Bi_2Sr_2CaCu_3O_8$
CCD: Charge Coupled Device
EELS: Electron Energy Loss Spectroscopy
FET: Field-Effect Transistor
HR-XTEM: High-Resolution Cross-Sectional TEM
HTS: High-Temperature Superconductor
I: Insulator
JJ: Josephson Junction
JoFET: Josephson FET
LAO: $LaAlO_3$
LSAO: $LaSrAlO_4$
LSAT: $(La_{0.29}, Sr_{0.71})(Al_{0.65}; Ta_{0.35})O_3$
LSCO: $La_{2-x}Sr_xCuO_4$
LCO: $La_2CuO_4$
M: Metal
MBE: Molecular Beam Epitaxy
ML: Monolayer
OVMBE: Organometallic Vapor Phase MBE
PLD: Pulsed Laser Deposition
QCM: Quartz Crystal Microbalance
RHEED: Reflection High-Energy Electron Diffraction
S: Superconductor
SIS: Superconductor-Insulator-Superconductor
SQUID: Superconducting Quantum Interference Device
SNS: Superconductor-Normal Metal-Superconductor
STO: $SrTiO_3$
SuFET: Superconducting FET
TEM: Transmission Electron Microscopy
TOF-ISARS: Time-Of-Flight Ion Scattering And Recoil Spectroscopy
UC: Unit Cell
XRD: X-Ray Diffraction
YBCO: $YBa_2Cu_3O_7$ The present invention is based on the unexpected discovery that the interface between insulating (I) and metallic (M) LSCO layers exhibits high-temperature superconducting behavior. Although each individual layer is not a superconductor, sequential deposition of I-M or M-I LSCO thin films yields a superconducting interface with a $T_c$ which depends on the deposition order. The superconducting region is confined to the interface, being located in an ultrathin region with atomically abrupt transitions between each region. It was also discovered that the phenomena is not limited to M-I bilayers, but extends to the interface between metallic and superconducting (S) LSCO layers. Deposition of M-S LSCO bilayers produces an interface with a transition $T_c$ which is approximately 25% higher than that of S alone. Interfacial superconductivity in M-I and M-S LSCO layers is confined to an ultrathin region which is robust, stable, and readily reproduced. A review of the structure and properties of LSCO have been provided, for example, by S. Uchida in "*Physical Properties of High $T_c$ Oxides*," Int. J. Mod. Phys. B 2, 181 (1988); S. W. Cheong, et al. in "*Properties of $La_2CuO_4$ and Related Compounds*," Physica C 158, 109 (1989); and by W. E. Pickett in "*Electronic Structure of the High-Temperature Oxide Superconductors*," Rev. Mod. Phys. 61, 433 (1989) each of which is incorporated by reference in its entirety as if fully set forth in this specification.

I. INTERFACIAL SUPERCONDUCTIVITY

The phenomenon of interfacial superconductivity was discovered while synthesizing a large number (over 200) of single-phase, bilayer, and trilayer films of LSCO with I, M, and S layers in various stacking sequences and with differing film thicknesses. Each layer was comprised of $La_{2-x}Sr_x CuO_{4-\delta}$ doped over a wide range of Sr (x) and oxygen (δ) concentrations. It is, however, to be understood that interfacial superconductivity is not confined to LSCO films, but is also applicable to a variety of other materials, particularly other. HTS cuprates and materials systems wherein the electrical conductivity can be varied through changes in the dopant concentration. In particular, interfacial superconductivity is applicable to any material system in which charge depletion and accumulation across the interface between two materials occurs due to differences in their chemical potentials and in which superconducting pairing correlations develop in this two-dimensional electron fluid.

A. Thin Film Growth

The films were grown using a unique atomic-layer-by-layer MBE (ALL-MBE) system comprised of an ultra-high vacuum chamber equipped with sixteen resistively-heated thermal evaporation or electron-beam sources capable of producing an atomic beam of each source material. The beams are controlled by mechanical shutters which open and close at precise intervals to deliver controlled doses of the desired material to the substrate. The system is also equipped with monitoring tools such as a scanning quartz crystal microbalance (QCM) which permits control of absolute deposition rates. The deposition process is controlled with pinpoint accuracy; the system is capable of depositing one percent of an atomic monolayer or better.

The ALL-MBE chamber is also equipped with in situ state-of-the-art surface science tools such as reflection high-energy electron diffraction (RHEED) and time-of-flight ion scattering and recoil spectroscopy (TOF-ISARS). These advanced surface science tools provide real-time information on the film surface morphology, chemical composition, and crystal structure. The system is wired to a hardware control system, being operated by a software program which enables the user to track and control parameters such as the temperature and deposition rate of each source, the position of each shutter, the oxygen or ozone pressure, substrate position and orientation, and thus to control the stoichiometry of a single monolayer. The system is, by design, well-suited for depositing alternating atomic layers with a precision better than a fraction of one atomic layer, thereby enabling the synthesis of artificial superlattices. The ALL-MBE system and its operation are described, for example, by Bozovic as previously noted as well as G. Logvenov, et al. in *"Artificial Superlattices Grown by MBE: Could We Design Novel Superconductors?"* Physica C 468, 100 (2008), by A. Gozar, et al. in *"Surface Structural Analysis of Atomically Smooth BaBiO$_3$ films,"* Phys. Rev. B 75, R201402 (2007), and by I. Bozovic in *"Experiments With Atomically Smooth Thin Films of Cuprate Superconductors: Strong Electron-Phonon Coupling and Other Surprises,"* Russian Physics Uspekhi 178, 170 (2008) which are each incorporated by reference as if fully set forth in this specification.

It is to be understood that growth of the metallic, insulating, and superconducting layers described in this specification is not limited to MBE or ALL-MBE, but may also be performed by any growth technique which provides sufficient control over the deposition conditions, including parameters such as beam fluxes, growth temperature, chamber pressure, and the like. Examples of such processes include PLD, sputtering techniques such as rf and ion beam sputtering, as well as chemical routes such as atomic layer deposition, chemical vapor deposition, or organometallic vapor phase epitaxy (OVMPE) as disclosed, for example, in U.S. Pat. No. 5,458,086 to Smith, et al. which is fully incorporated into this specification.

ALL-MBE enables synthesis of films with atomically smooth surfaces as well as multilayers with atomically sharp interfaces. The multilayers may be formed by stacking molecular layers of different compounds. It is possible to introduce or omit atomic monolayers within a single molecular layer and thereby form novel compounds. Typical surface roughness values of as-deposited LSCO films obtained from atomic force microscopy (AFM) data is 0.2 to 0.5 nm, less than the height of one unit cell (UC) which, in LSCO, is 1.3 nm. ALL-MBE provides for digital control of layer thicknesses, which are measured by counting the number of UCs. Maintaining atomic scale smoothness and digital layer-by-layer growth are both crucial to attainment of interfacial superconductivity. All LSCO films were grown by ALL-MBE on 10×10 mm LSAO(001) substrates with the LSCO c-axis perpendicular to the LSAO surface.

B. Electrical Measurements

Single-phase films of LCO and overdoped $La_{1.55}Sr_{0.45}CuO_4$ were initially deposited onto separate LSAO substrates at a growth temperature of nominally $T_s$=650° C. with an ozone pressure in the range of $10^{-5}$ to $10^{-6}$ Torr. The LCO film was also subjected to a post-deposition anneal under vacuum. Resistivity measurements of the films were carried out in a four-point-contact configuration with the current and voltage leads wire-bonded onto evaporated gold (Au) pads. Mutual inductance data were acquired at a frequency $\nu$=10 kHz using a lock-in amplifier in the 'transmission' geometry in which the sample was sandwiched between the drive and pick-up coils. At each temperature the value of the critical current was determined as the point above which the correlation function for the low current linear fit dropped below R=0.9995.

Figure 1B:
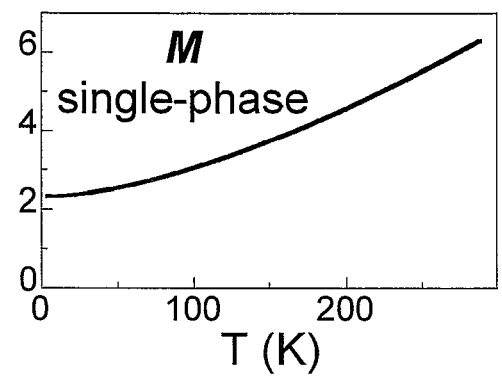

The electrical resistance R of LCO and $La_{1.55}Sr_{0.45}CuO_4$ single-phase films was measured as a function of temperature and the results are shown in FIGS. 1A and 1B, respectively. FIG. 1A shows that R(T) for LCO increases gradually with decreasing temperature, exhibiting behavior characteristic of an electrical insulator. On the other hand, FIG. 1B shows that the resistance of the $La_{1.55}Sr_{0.45}CuO_4$ layer decreases continuously with decreasing temperature and appears to saturate at a finite, non-zero value as the temperature approaches zero. This type of behavior is characteristic of a metallic conductor.

Figure 1C:
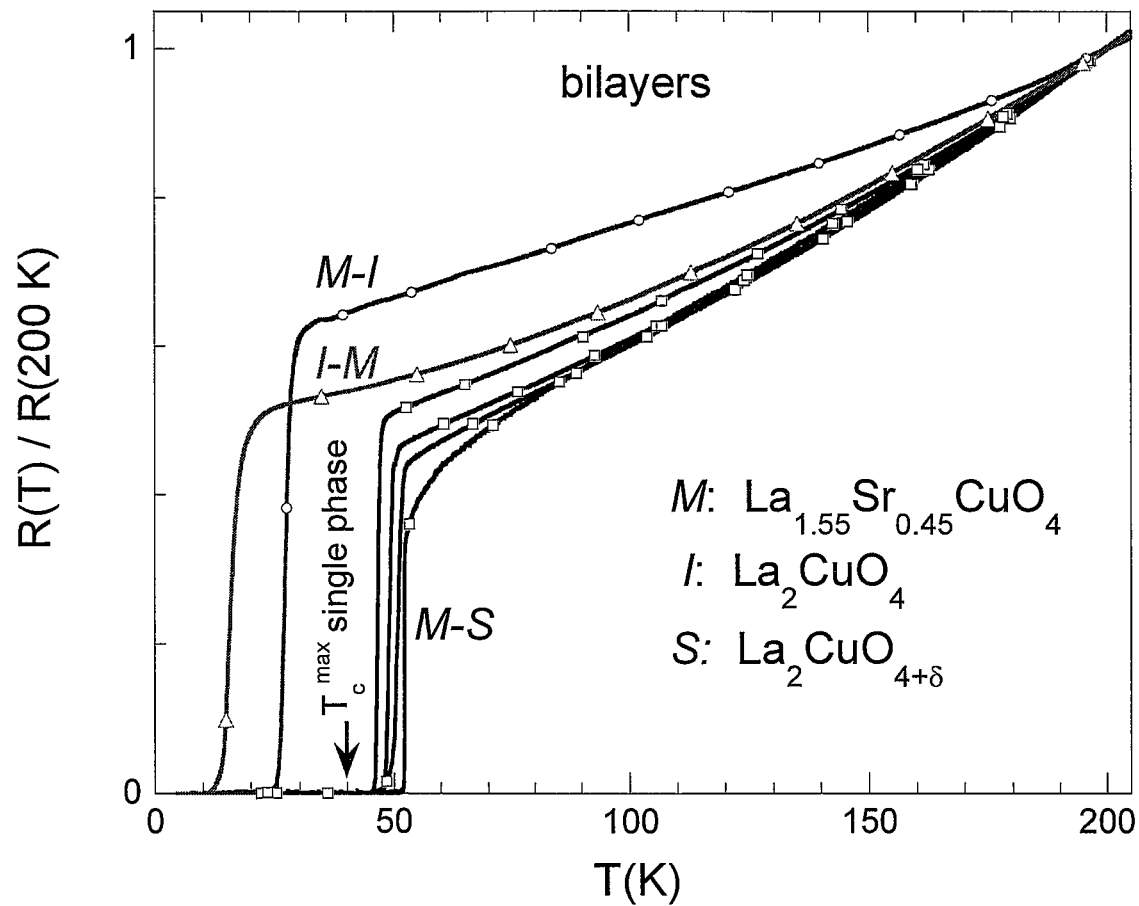

Thick films of insulating LCO (I) and metallic $La_{1.55}Sr_{0.45}CuO_4$ (M) were sequentially deposited on LSAO (001) substrates to yield M-I or I-M bilayers. The thickness of constituent layers was varied digitally from one half UC (0.66 nm) up to 20 UC (33 nm). Throughout this specification, the first letter in a sequence denotes the layer which is deposited directly onto the substrate. R(T) of the resulting M-I and I-M bilayers was measured, normalized to R(200 K) and the results are plotted in FIG. 1C. The I-M and M-I bilayers show a robust, reproducible transition to superconductivity at a high $T_c$ even though neither I or M is superconducting per se. The transition temperature and width are stable, exhibiting essentially no change over a period spanning at least several weeks. The sequence in which the layers are deposited yields differing $T_c$ values. If both I and M layers are sufficiently thick, $T_c \approx 30$ K in M-I structures whereas $T_c \approx 15$ K in I-M bilayers. Growth of an initial, thick M layer ($La_{1.55}Sr_{0.45}CuO_4$) followed by a superconducting (S) layer produced an unexpected ~25% increase of $T_c$ to ≈50 K. Four different M-S layers are illustrated in FIG. 1C, with each exhibiting a $T_c$ larger than the maximum value observed for single-phase films (labeled as $T_c^{Max}$ in FIG. 1C). These results suggest that interfacial superconductivity is also present in M-S layers and that the phenomena is robust, being easily reproduced.

Figure 2:
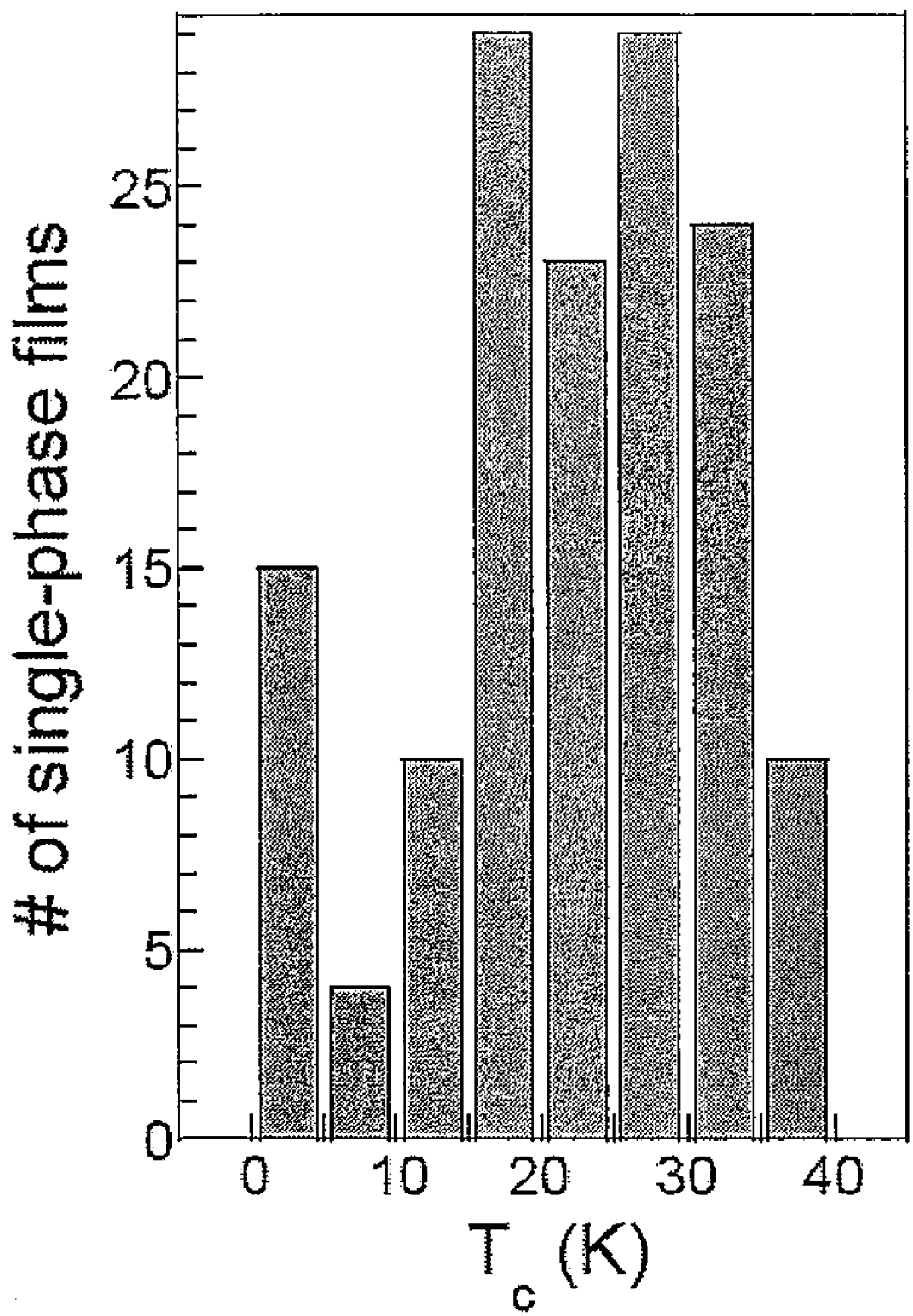
FIG. 2 is a histogram showing the critical temperatures $T_c$ for single-phase LSCO films (>150 total) grown with a wide range of Sr and O concentrations.

Single-phase superconducting layers of $La_2CuO_{4+\delta}$ may be formed by annealing undoped and insulating LCO films in an oxygen ambient at elevated temperatures. In an ozone ambient this can be accomplished at temperatures as low as 150° C. This produces superconducting $La_2CuO_{4+\delta}$ (S) single phase films. Superconducting LSCO layers may also be formed by doping with Sr to concentrations in the approximate range given by $0.06 \leq x \leq 0.25$. A $T_c$ histogram of all LCO and LSCO single-phase superconducting films grown during the course of this work is shown in FIG. 2 which includes data from more than 150 films. The Sr concentration was varied over a very broad range, spanning the entire LSCO phase diagram. The film thickness and oxygenation state were similarly varied. From among these, $T_c^{Max} = 40$ K (identified by the arrow in FIG. 1C) is the highest value produced from any single-phase LSCO film, being similar to that observed in bulk single crystals. Bulk $T_c$ values for LSCO have been reported by, for example, Y. Hidaka, et al. in "*Anisotropic Properties of Superconducting Single-Crystal $(La_{1-x}Sr_x)_2CuO_4$*," Jpn. J. Appl. Phys. pt. 2, vol. 26, L377 (1987); T. Iwazumi, et al. in "*Preparation and Property of $La_{1.85}Sr_{0.15}CuO_4$ Single Crystal*," Jpn. J. Appl. Phys. Pt. 2, vol. 26, L386 (1987); and T. J. Allen, et al. in "*Synthesis, Structure, and Superconductivity of Single Crystals of High-$T_c$ $La_{1.85}Sr_{0.15}CuO_4$*," Inorg. Chem. 26, 1190 (1987) each of which is incorporated by reference as if fully set forth in this specification.

A $T_c$ exceeding 40 K was not observed for any single-phase film grown in this work, in sharp contrast to the $T_c \approx 50$ K reproducibly observed in M-S bilayers. This suggests that the 25% increase in $T_c$ for M-S bilayers originates from the interface. Furthermore it is unlikely that Sr interdiffusion can be used to explain this relative enhancement: it seems improbable that bilayer growth always results (by uncontrolled interdiffusion) in the optimal Sr concentration for $T_c \approx 50$ K, but not (for >150 times) when depositing a single layer.

A $T_c$ approaching 50 K for single-phase LSCO films grown on LSAO substrates has been reported by J.-P. Locquet, et al. (hereinafter "Locquet") in "*Doubling the Critical Temperature of $La_{1.9}Sr_{0.1}CuO_4$ Using Epitaxial Strain*," Nature 394, 453 (1998) and by H. Sato, et al. (hereinafter "Sato") in "*$La_{2-x}Sr_xCuO_y$ Epitaxial Thin Films (x=0 to 2): Structure, Strain, and Superconductivity*," Phys. Rev. B 61, 12447 (2000), both of which are incorporated by reference. The $T_c$-enhanced LSCO layers reported by Locquet and Sato are single-phase with Sr and O concentrations within the superconducting range. The increase in $T_c$ observed by Locquet and Sato is attributed primarily to epitaxial strain arising from the differing lattice constants of the film and substrate and does not appear to be due to any type of interfacial effect. In fact, there is no reported observation of interfacial superconductivity in the LSCO films produced by Locquet and Sato.

The length scale associated with interface superconductivity is determined by synthesizing a series of M-I and I-M structures with thick bottom layers (t=40 UCs or 52 nm) while digitally increasing the thickness of the top layer half a UC at a time. These samples were also vacuum annealed in situ on cool down from approximately 550° C. Further prolonged annealing was performed ex situ at temperatures between 150 and 300° C. and annealing times ranging from 15 min to 2 h in a single run with many samples undergoing annealing several cycles. R(T) was measured before and after annealing and $T_c$ values were obtained from the resulting data. The results showed that there was no change in $T_c$ with annealing, indicating that the oxygen concentration in these layers is in a regime where there is no bulk interstitial oxygen and that the $CuO_2$ plane structure remains intact.

Normalized R(T) data as a function of the top layer thickness is shown in FIGS. 3A and 3B for a series of I-M and M-I layers, respectively. The transport data in FIG. 3A shows that I-M bilayers with a top M layer less than 2 UC thick is not superconducting. R(T) for a 0.5-UC-thick M layer increases upon cooling whereas the 1.5 UC structure shows a metallic (dR/dT>0) to insulating (dR/dT<0) crossover near T=75 K (not shown). Increasing the thickness of M from 2.5 to 20 UC results in a continuous increase in $T_c$ to a maximum of ~15 K. Transport data for M-I structures differs in both $T_c$ and its thickness dependence. FIG. 3B shows that $T_c$ also increases as the thickness of I increases albeit at a much faster rate. The onset of superconductivity at approximately 10 K is apparent even when the M layer is covered by only a 0.5-UC-thick (0.65 nm) I layer. When 1 UC of I covers the surface of M, the superconducting transition is complete with $T_c$>10 K. $T_c$ quickly attains a maximum of ~30 K for M-I layers when I is $\geq$2-UC-thick.

The as-measured $T_c$ values (defined here as the midpoint of the resistive transition) are plotted as a function of the top layer thickness for M-I and I-M bilayers in FIG. 3C. The dotted lines in FIG. 3C are provided as a guide to the eye. The M-I structures were subsequently annealed at elevated temperatures of 150 to 250° C. for 15 to 60 min in an ozone atmosphere. Annealing in ozone introduces additional oxygen into the I layer, converting it into a superconductor while having essentially no effect on the underlying M layer. This produces M-S bilayers which exhibit still further increases in $T_c$. FIG. 3C shows that $T_c$ for M-S structures increases continuously with increasing top layer thickness, saturating at approximately 50 K for thicknesses $\geq$5 UC.

Although the data provided in FIGS. 1-3 provide strong indirect evidence that the phenomenon is an interfacial effect, additional experiments and analyses were performed for further verification. In order to rule out potential effects arising from variability in growth conditions and sample cool-down processes, two methods of simultaneously producing single-phase layers and bilayers were devised. In one instance, I layers were concurrently grown on bare LSAO substrates and on previously grown M layers. This experiment was also performed for M layers grown on I layers. In another instance ion milling was used to remove the top layer from a portion of a bilayer film. This produced an area with only a bottom layer while the rest of the substrate was formed of a bilayer. This substrate was also prepared such that the two regions are electrically isolated and R(T) can be independently measured. In both instances the R(T) results showed that the bilayers are superconducting whereas the single-phase films are not. These results tie superconductivity directly to the interface between the metallic and insulating cuprate layers. Similar control experiments were performed to compare M-S structures and single-phase S films which were grown simultaneously. The results again showed that the bilayer structures had systematically higher $T_c$ values by at least 10 K.

The $T_c$ enhancement in M-S bilayers and single-phase S layers was analyzed using two-coil mutual inductance measurements. Critical current measurements were performed at a fixed temperature while the drive coil current $I_{drive}$ was varied. FIG. 4A shows the dependence of the pick-up voltage $V_{pick-up}$ on the current in the drive coil drive for a M-S bilayer at temperatures ranging from $T_s$=13 to 45 K. At each temperature a 'critical' value of the current in the drive coil $I_{dc}$ corresponds to the onset of dissipation in the film and can be defined as the crossover point between a linear (n=1) and higher-power law (n$\approx$3 at temperatures below 40 K) behavior. The temperature dependence of $I_{dc}$ for a S film (filled diamonds) and a M-S bilayer (empty squares) is provided in FIG. 4B. The scale on the right hand side in FIG. 4B shows the calculated peak value of the induced screening current density ($j_c$) in superconducting films. The arrows along the bottom axis denote critical temperatures of $T_c$=33.2 K and $T_c$=51.6 K for the S and M-S films, respectively.

The observed linear temperature dependence of $j_c$ in S films is expected theoretically in cuprates for the intrinsic critical current due to vortex-antivortex pair breaking or depinning in homogeneous samples and it is observed experimentally in high-quality HTS films and bulk single crystals. Data for the M-S bilayer shows a clear break near 40 K where the curve is divided into two approximately linear, but well-defined components. These two distinct regions exhibit very different slopes and arise due to separate contributions from the bulk of the S layer and the M-S interface. This is expected from two superconducting sheets with different thickness and critical temperature such as $d_1$, $T_{c1}$ and $d_2$, $T_{c2}$. The breakdown into two such components (shown by the dashed lines in FIG. 4B) provides $T_{c1}$~40 K and $T_{c2}$~50 K. The low-temperature extrapolation of the best fit to the two linear components of the $I_{dc}$ data to $T_s$=0 K yields $d_1/d_2$~20. Since the total number of layers deposited was $d_1+d_2$=20 UC, one obtains $d_2$~1 UC. This length scale is quantitatively consistent with the independent measurements of resistivity in M-S bilayers as a function of top layer thicknesses (see FIG. 3C).

The results shown in FIGS. 4A and 4B, indicate that $T_c$≈50 K in M-S structures is, in fact, confined to a very thin (1 to 2 UC thick) layer near the interface. The bilayer structure and $T_c$ contribution from each component are shown by the schematic in the lower left of FIG. 4B. The inset in the upper right corner shows the same data plotted in reduced temperature units $T/T_c$. The magnitude of the estimated low-temperature critical current of the thin interfacial layer is in agreement with the value estimated from mutual inductance and transport measurements in M-I bilayers in which the HTS ($T_c$=30 K) sheet has a similar thickness.

Figure 5:
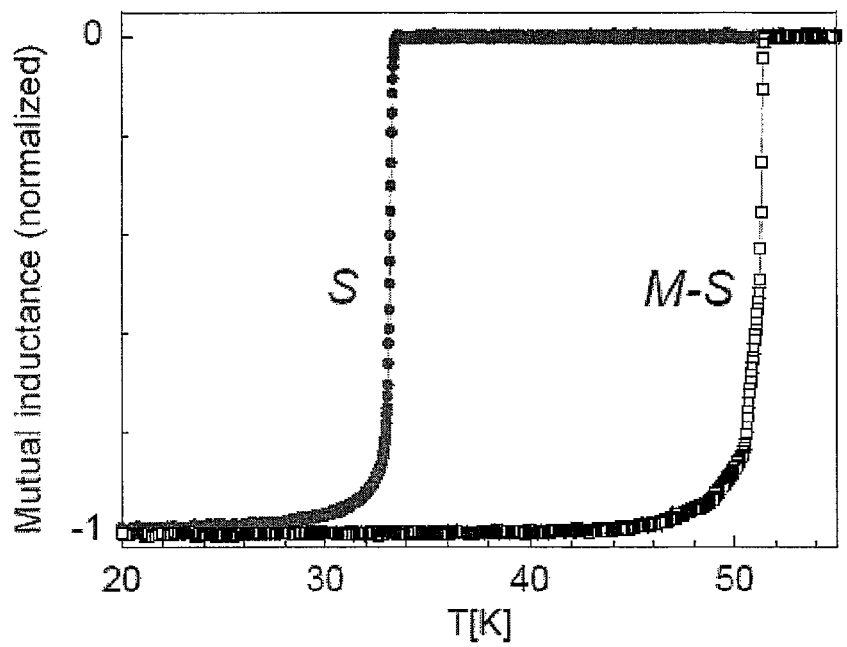
FIG. 5 is a plot showing the temperature dependence of the imaginary part of the mutual inductance of a single-phase S film and M-S bilayer.
Figure 6A:
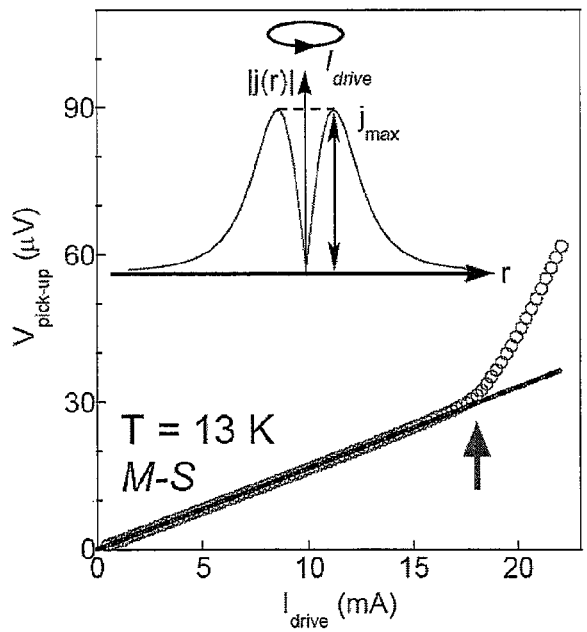
FIG. 6A shows the dependence of the pick-up voltage $V_{pick-up}$ on the drive coil current $I_{drive}$ at $T_s$=15 K for a M-S bilayer.
Figure 6B:
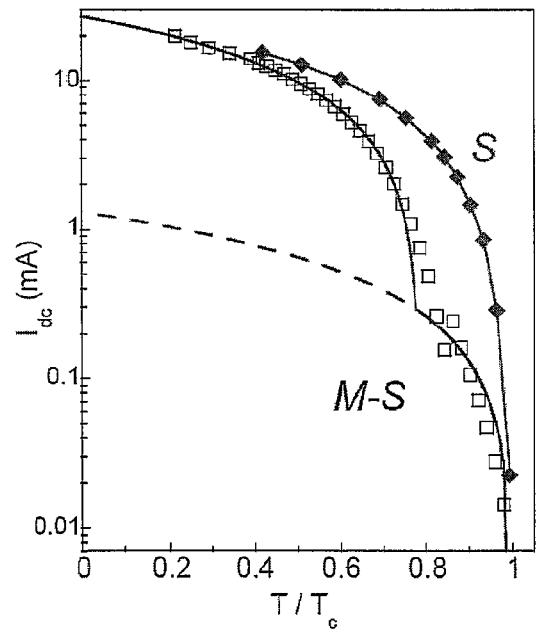
FIG. 6B is a semi-log plot of the critical drive current $I_{dc}$ as a function of $T/T_c$ which was obtained using the data in FIG. 4B.

The dependence of $V_{pick-up}$ on $I_{drive}$ and the acquisition of $I_{dc}$ is explained in additional detail below with reference to FIGS. 5 and 6. FIG. 5 shows the temperature dependence of the mutual inductance in single-phase S and M-S bilayer samples. The sharp drop in the inductive response shows $T_c$=33.2 K and 51.6 K for S and M-S samples, respectively. The data in FIG. 5 was acquired with the drive coil current $I_{drive}$ set at 5 µA. The dependence of the pick-up voltage $V_{pick-up}$ on the drive coil current $I_{drive}$ for a M-S bilayer at 13 K is reproduced in FIG. 6A. The slope of the linear response in the data renders the value of the mutual inductance at that temperature. The arrow marks the value where there is a shift in the linear dependence of $V_{pick-up}$. This shift defines the value for the critical drive coil current $I_{dc}$ at that temperature. The inset of FIG. 6A shows a typical radial current density profile j(r) screening the magnetic field generated by $I_{drive}$. The critical current density in the film was identified with $j_{max}$, the peak value of the screening current corresponding to $I_{dc}$. The current density profile was calculated using the method outlined by J. R. Clem in "Vortex Dynamics in a Type-II Superconducting Film and Complex Linear-Response Functions," Phys. Rev. B 46, 14662 (1992) which is incorporated by reference as if fully set forth in this specification. The dependence of $I_{dc}$ in M-S and S films on $T/T_c$ over the entire temperature range is plotted in FIG. 6B. The data are identical to that presented in FIG. 4B, but here the interface contribution to superconductivity (shown by the dashed line) in the M-S layer is emphasized by the semi-logarithmic scale.

C. Nanostructure Characterization

Figure 7A:
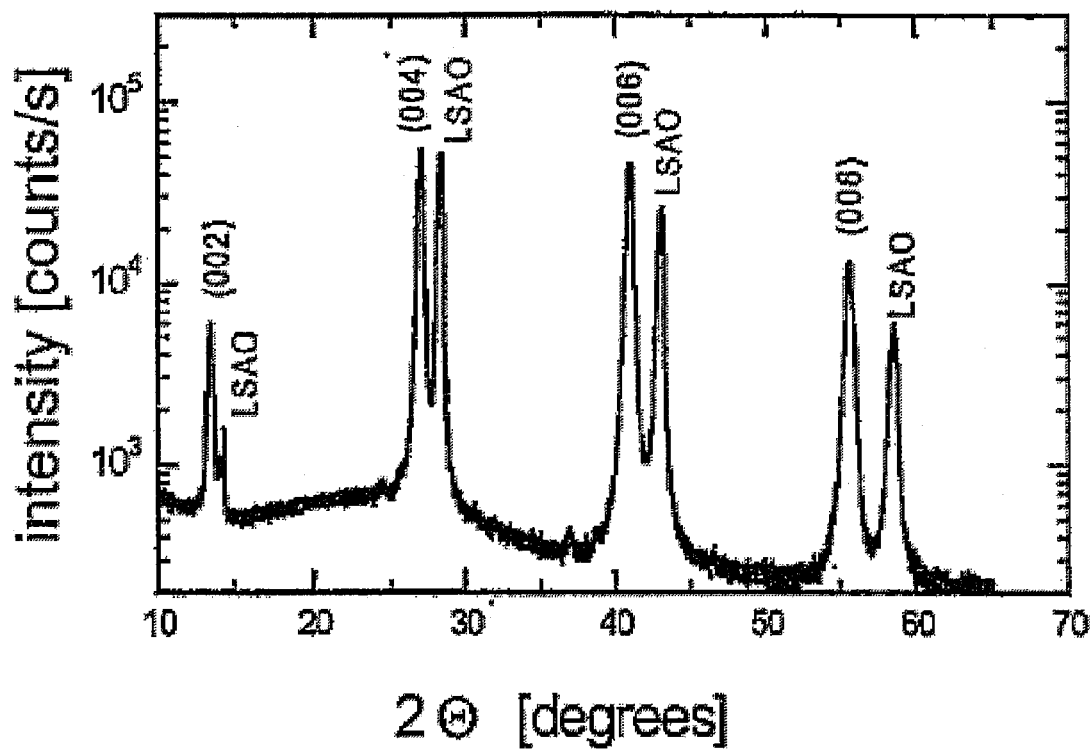
FIGS. 7A and 7B are normal and off-axis X-ray diffraction θ-2θ scans, respectively, from a M-I bilayer.
Figure 7B:
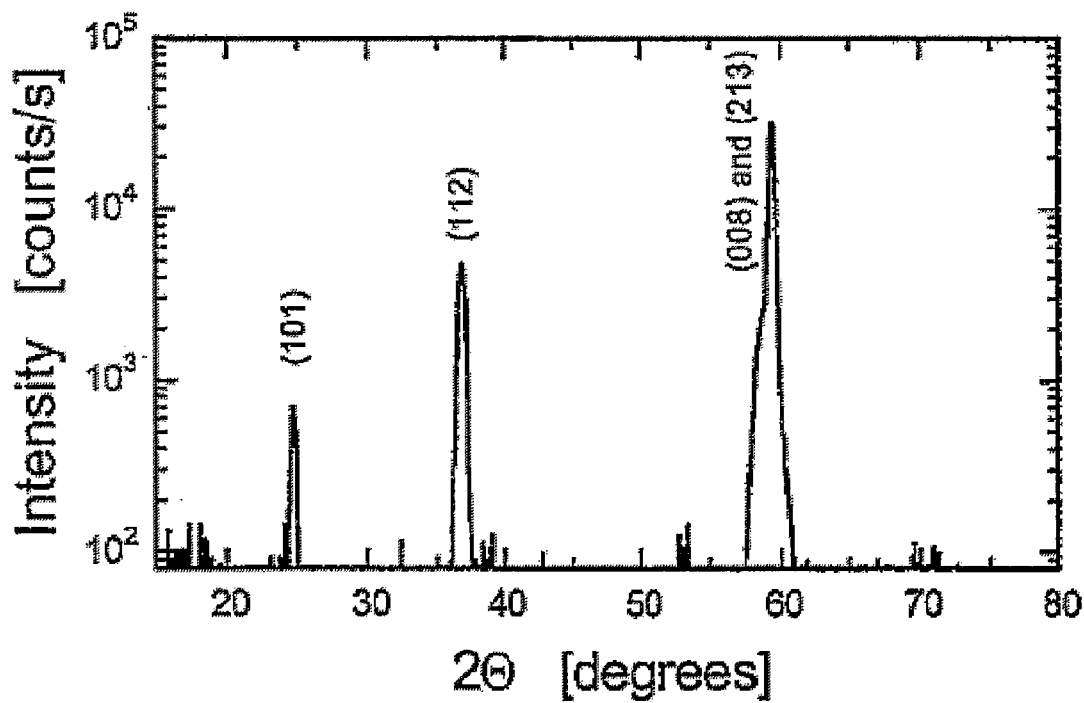

A variety of structural and surface-sensitive probes have been used to analyze the chemical and structure of the superconducting interface. X-ray diffraction (XRD) was used to determine the crystal structure of a typical M-I bilayer comprised of a 23-UC-thick M layer and 40-UC-thick I layer. The layer thicknesses were intentionally chosen to be different in order to eliminate interference fringes. A θ-2θ scan obtained from the M-I bilayer is shown in FIG. 7A. The XRD diffraction pattern in FIG. 7A shows sharp substrate (marked as LSAO) and film peaks with narrow FWHM values which is indicative of excellent crystallinity. All LSCO layers grow with the c-axis perpendicular to the LSAO surface. The in-plane epitaxial orientation is $La_2CuO_{4[}001]//La_{1.55}Sr_{0.45}CuO_{4[}001]//LaSrAlO_{4[}001]$. An off-axis XRD scan is shown in FIG. 7B. From the (101) and (112) diffraction peaks, the in-plane lattice constant of the film can be determined as ~3.75 Å which is essentially identical to that of the LSAO substrate. Since the lattice constants of bulk LCO and $LCO_{4+\delta}$ layers are greater than that of LSAO, the XRD results indicate that at this thickness the films are fully strained and pseudomorphic. This means that the crystal structure of the film has been compressed to match that of the underlying substrate. The lattice constants of LCO, $LCO_{4+\delta}$, and LSAO bulk crystals are provided in Table 1 below. For LSAO, the values in parentheses are for a UC which has been doubled and rotated by 45° to facilitate comparison. The lattice constants in Table 1 have been measured, for example, by P. G. Radaelli, et al. in "Structural and Superconducting Properties of $La_{2-x}Sr_xCuO_4$ as a Function of Sr Content," Phys. Rev. B 49, 4163 (1994) and J. D. Jorgensen, et al. in "Superconducting Phase of $La_2CuO_{4+\delta}$: A Superconducting Composition Resulting From Phase Separation," Phys. Rev. B 38, 11337 (1988) which are both incorporated by reference as if fully set forth in this specification.

TABLE 1

| Sample | $a_0$ (Å) | $b_0$ (Å) | $c_0$ (Å) |
| --- | --- | --- | --- |
| $La_2CuO_4$ | 5.4004 | 5.3574 | 13.1555 |
| $La_2CuO_{4+\delta}$ | 5.3346 | 5.3969 | 13.1646 |
| $LaSrAlO_4$ | 3.7564 (5.3123) | 3.7564 (5.3123) | 12.6357 |

Real-time, in-situ grazing-angle RHEED data provide atomic-scale information on the surface morphology during film growth. They can also reveal nucleation of secondary-phase precipitates that could emerge due to imprecise stoichiometry values or inadequate thermodynamic or kinetic parameters during growth. Oscillations in the intensity of the specular reflection in RHEED are a well-established signature of layer-by-layer growth. Furthermore, RHEED oscillations for each compound exhibit a characteristic amplitude and shape. These differences arise due to factors such as the chemical composition, nature of surface states (i.e., whether it is metallic or insulating), and/or presence of a specific growth mode at a given temperature and pressure. Thus, RHEED can provide excellent qualitative information on transitions from one layer to another, including whether this transition is abrupt or continuous.

Figure 8:
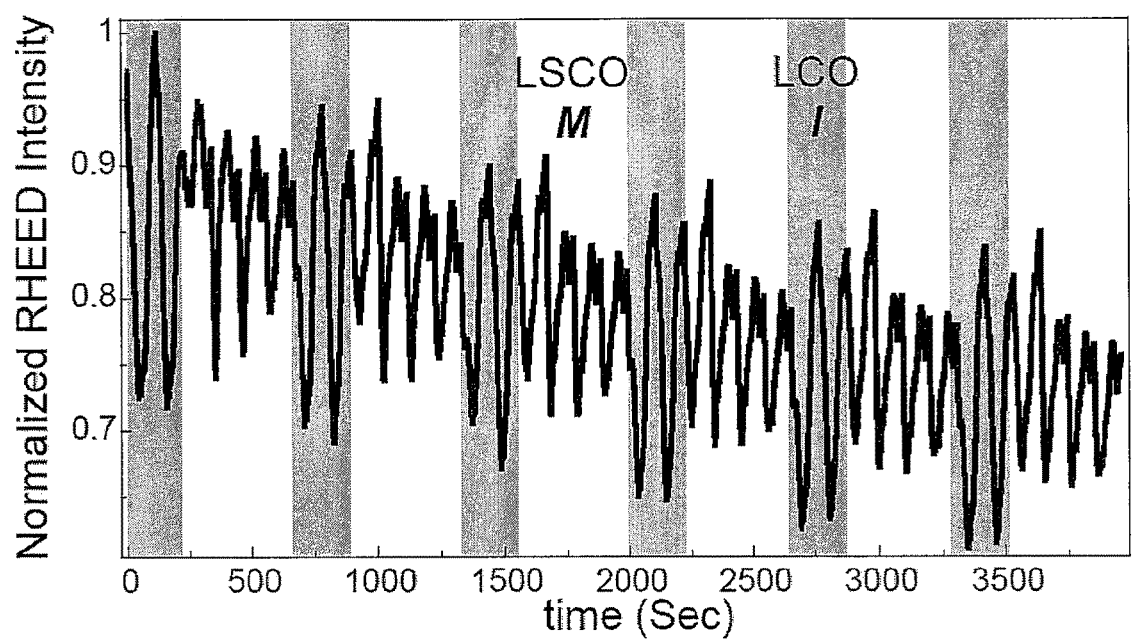
FIG. 8 shows reflection high-energy electron diffraction intensity oscillations of the specular beam during growth of an I-M superlattice.

A typical pattern of RHEED oscillations recorded during growth of an . . . -I-M-I-M- . . . superlattice is shown in FIG. 8. The superlattice is comprised of I-M bilayers having one UC of I and two UC of M which are repeated n times as identified by the notation $[(1\times I):(2\times M)]_n$. In FIG. 8, I layers are indicated by the shaded regions whereas M layers are unshaded. The RHEED oscillation pattern in FIG. 8 shows that when growth is switched between the two materials, the shape and amplitude of the oscillation pattern changes abruptly on the 0.5 UC scale from that typical of single-phase I layers to that of single-phase M films. This indicates that the interface between each layer is atomically sharp regardless of the deposition sequence. In this specification, an atomically sharp transition is defined as one in which the transition from one layer of atoms to another is abrupt on an atomic scale. This means that there is no concentration gradient or gradual transition from one layer to the other. The change in material is abrupt on the scale of the size of the atomic constituents within individual planes of atoms. The RHEED results in FIG. 8 suggest that there is no interdiffusion of Sr between I and M layers over more than 0.5 UC along the growth direction.

TOF-ISARS is a surface-sensitive technique for in-situ measurements of the chemical composition which was used to set an absolute upper limit on the amount of possible Sr diffusion along the growth direction. The evolution of the peak associated with recoiled Sr from top surface layers as a result of elastic binary collisions with the incoming 10 keV $K^+$ projectiles is monitored during film growth. The parameters were tuned to maximize the surface sensitivity; single-scattering events were monitored using a low incidence angle ($\alpha=15°$) and a low-index crystallographic azimuth [100].

Figure 9:
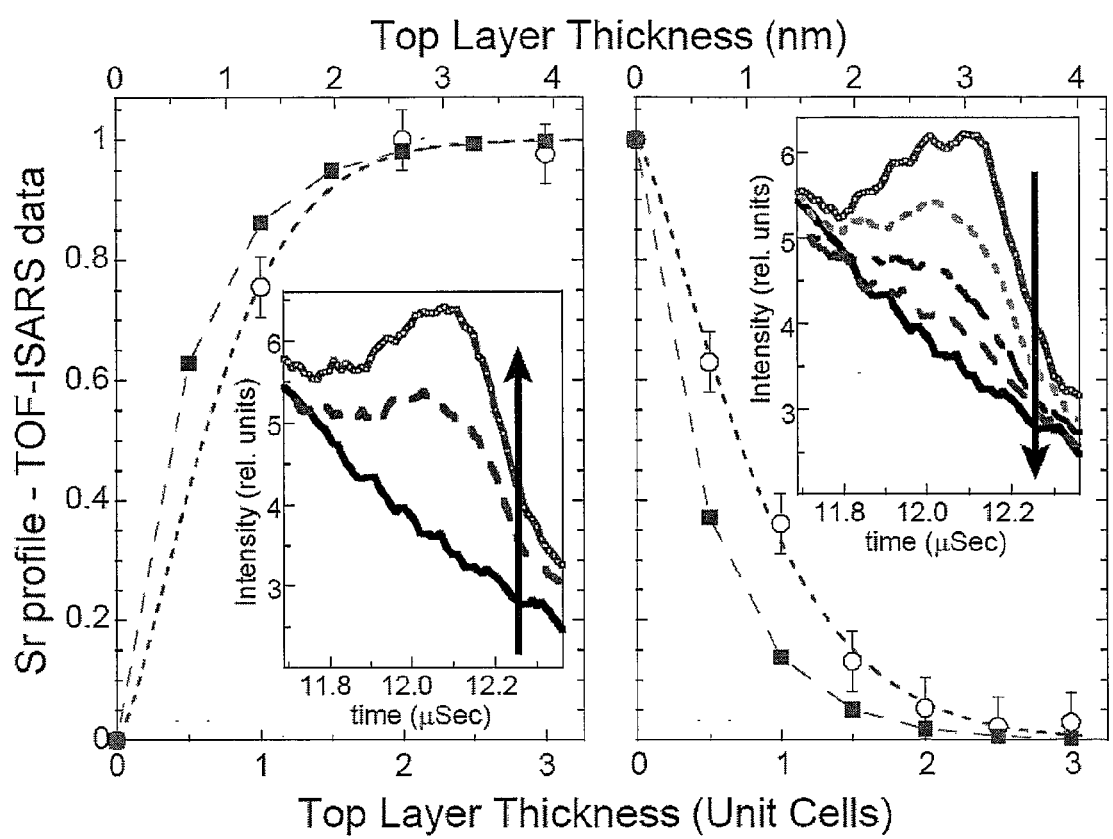
FIG. 9 shows TOF-ISARS data as a function of the top layer thickness for I-M (left) and M-I (right) bilayers.

FIG. 9 shows TOF-ISARS data as a function of film thickness on the M side of an I-M structure (at left) and the I side of an M-I structure (at right). The normalized integrated intensity of the Sr recoil peak in M and I as a function of film thickness is shown by the open circles in the left and right graphs, respectively. The dashed lines connecting the data points are merely provided as a guide to the eye. The insets in the left and right plots show the evolution of the Sr recoil peak in the M and I layers, respectively, with increasing thickness. Assuming that the integrated intensity of the Sr recoil peak is proportional to the surface concentration of Sr we can put an upper limit of 1 UC for the scale over which Sr diffusion could provide a doping level. This is most likely an overestimate because a substantial contribution in the TOF-ISARS spectra comes from projectiles that penetrate beyond the top 0.5 UC thick layer. Some residual Sr intensity can even be picked up from outside of the substrate area when the $K^+$ beam is swept across the sample.

A rough estimate of the Sr profile is obtained by assuming that scattering could arise from the 1.5 UC thick top layer and that possible cation interdiffusion is proportional to the nominal difference in the Sr concentration between adjacently deposited layers. The results of this model are shown by the solid squares in FIG. 9. The simulated data shows good agreement with experimentally determined intensities and reveals a Sr profile which can be identified as the LSCO fraction across the interface.

Confirmation of the physical and chemical structure of the interface in M-I layers was obtained by high-resolution cross-sectional transmission electron microscopy (HR-XTEM) and electron energy loss spectroscopy (EELS) analyses as disclosed by A. Gozar, et al. in "*High-Temperature Interface Superconductivity Between Metallic and Insulating Cuprates,*" Nature 455, 704 (2008) which is incorporated by reference as if fully set forth in this specification. HR-XTEM and EELS results affirm that the M-I interface contains no substantial third interfacial layer, and that the interface itself is atomically smooth, structurally perfect, with an atomically sharp transition between layers.

D. Physical, Chemical, and Electrical Origins

Results obtained from XRD, RHEED, TOF-ISARS, HR-XTEM, and EELS analyses support and are consistent with the presence of structurally and chemically abrupt M-I, I-M, and M-S interfaces. Mutual inductance measurements have also identified that the increase in $T_c$ is confined to and originates from the interfacial layer. However, these results do not provide an explanation for the occurrence of interfacial superconductivity in these cuprate bilayers. Possible causes of this phenomenon are: (a) cation interdiffusion, (b) electronic reconstruction, and (c) oxygen vacancies created in the M layer or oxygen interstitially trapped in the I layer at locations very close to the interface during growth (e.g., oxygen non-stoichiometry). The electrical, chemical, and structural analyses of the bilayers in Sections A-C set an upper limit on possible cation interdiffusion to less than 1 UC and make the cation mixing scenario difficult to reconcile quantitatively and qualitatively with the experimental observations.

Figure 10:
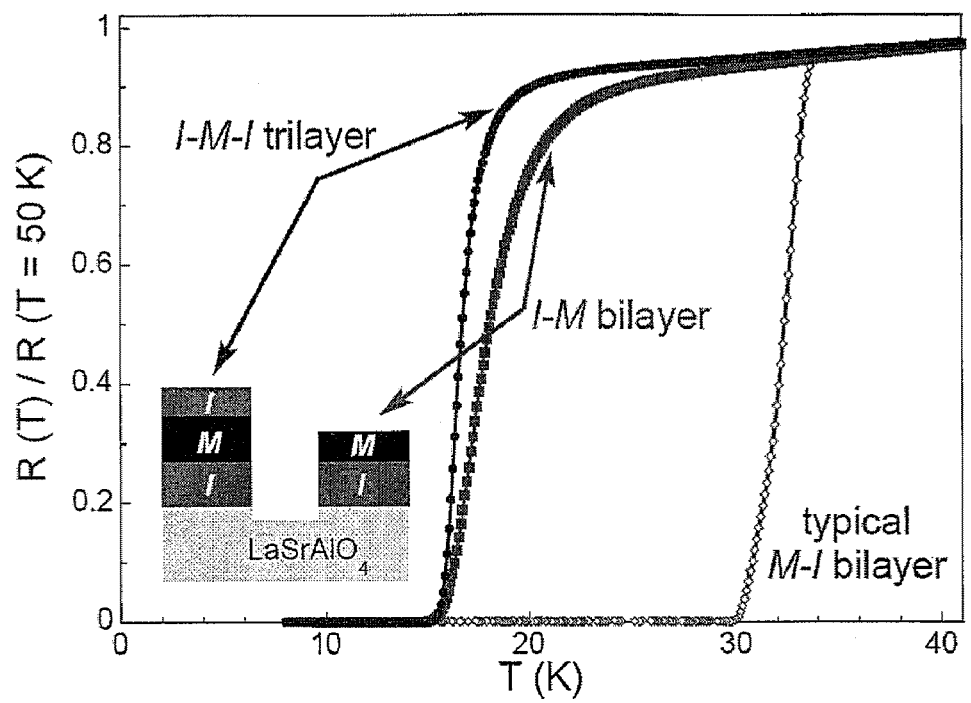
FIG. 10 shows normalized R(T) plots for a 35-35-12 UC thick I-M-I trilayer and an I-M bilayer formed on the same substrate.

Despite the improbability of cation diffusion, this was further investigated by analyzing charge transport in I-M-I trilayers. As previously noted, M-I bilayers exhibited a $T_c$ of approximately 30 K (e.g., FIG. 1C). However, FIG. 10 shows that in I-M-I trilayers $T_c$ is reduced by at least 15 K. The only difference between the M-I interfaces in the bi- and trilayer structures is the nature of the bottom layer and the proximity to the LSAO substrate. Neither cation interdiffusion nor oxygen off-stoichiometry alone can explain this result. In FIG. 10, a 35-35-12 UC thick I-M-I trilayer is compared with a I-M bilayer. The same $T_c$ of 15 K is observed for both I-M-I trilayers and I-M bilayers. The bottom I layer in I-M-I trilayers results in a reduced $T_c$ for the top M-I interface compared to $T_c$ values obtained for M-I bilayers with M adjacent to the substrate. A typical 40-5 UC M-I bilayer is shown by the open diamonds in FIG. 10.

It is possible that the roughness of the top M-I interface in the I-M-I trilayer increased because the buffer layer was twice as thick leading to the accumulation of defects. However, in-situ RHEED and TOF-ISARS analyses showed no indication of degradation in the surface structure. This indicates that the suppression of $T_c$ is not due to the large (70 UC) combined thickness of the bottom I and M films in the trilayer. I-M-I trilayers where the total thickness of the bottom I and M layers combined was twice as small (e.g., 35 UC as in a 23-12-12 UC structure) were fabricated and $T_c$ was still reduced by 15-20 K. These findings are not compatible with La/Sr interdiffusion, suggesting instead that long-range Coulomb interactions and/or lattice effects are responsible.

In view of the structural and electrical analyses in Sections A-C as well as the above considerations it is clear that interfacial superconductivity does not arise due to simple mixing of adjacent layers to form a third layer which is chemically and physically distinct. The phenomenon is an interfacial effect, being confined solely to the interface between the constituent layers.

Figure 11:
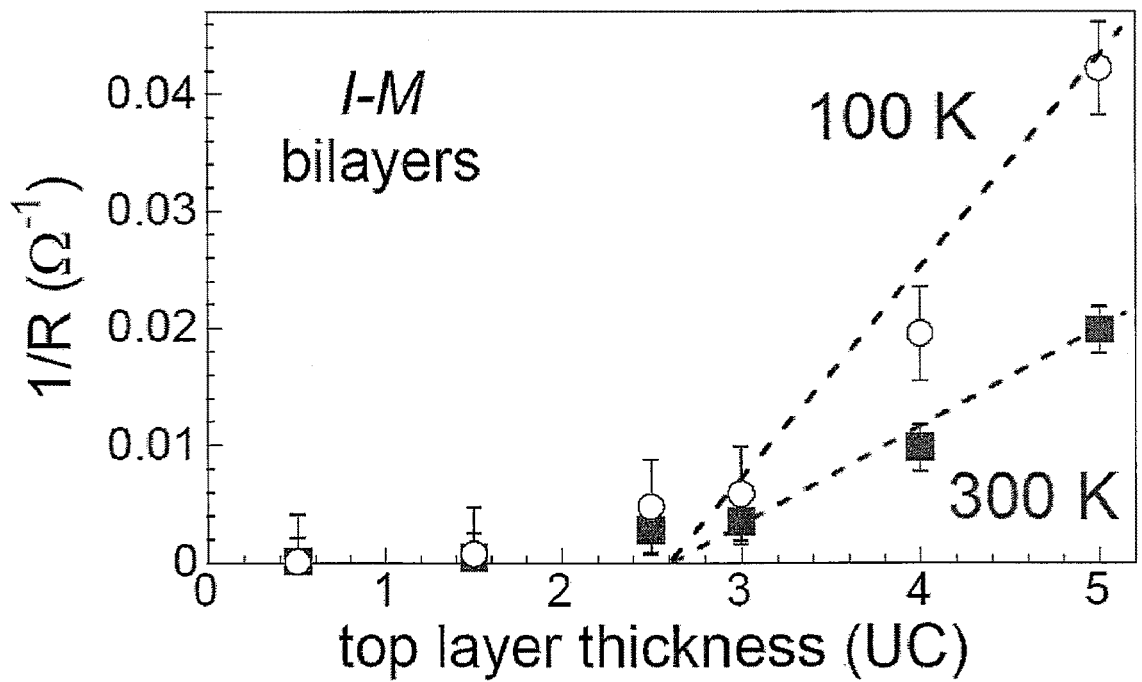
FIG. 11 is a graph showing the dependence of the inverse resistance on the thickness of the top layer in I-M bilayers at $T_s$=100 K and 300 K.

Any difference in the local structure at the I-M and M-I interfaces will directly impact the electrochemical potential and the dielectric properties. This can cause asymmetry in the screening length (and implicitly in the superconducting properties) at the two interfaces. The origin of the asymmetry in the superconducting properties of I-M and M-I bilayers can be inferred from the resistivity data shown in FIG. 11. As the thickness of the M layer in I-M structures is increased, the conductance at a fixed temperature stays low up to 2.5 to 3 UC and then it crosses over to a uniform linear increase. One possibility is that the first few M layers are disordered. In M-I structures, superconductivity occurs even when the top I layer is just 0.5 UC thick (FIG. 3B). The arguments so far suggest that the difference between M-I and I-M interfaces is in the presence of a 'dead' layer between the individual components in I-M bilayers. This conclusion is further corroborated by other experimental observations: the higher $T_c$ in M-I bilayers, the broader superconducting transition width in I-M structures, and the absence of enhanced $T_c$ in I-M bilayers after annealing in ozone.

A factor which could cause a disordered barrier and the presence of dead layers is oxygen non-stoichiometry. Oxygen vacancies and interstitials, for example, may account for the asymmetry between M-I and I-M structures. Note first that the LSAO substrate and the LSCO cuprate films in this study are stacks of polarized layers. For example, in $La_2CuO_4$ $[CuO_2]^{2-}$ planes alternate with two successive $[LaO]^+$ layers. At both the substrate-cuprate and M-I interfaces there is a change in the layer charge alternation pattern. In order to minimize the mismatch in polarization and/or chemical potential, the top I layer near the M-I interface can trap interstitial oxygen during growth and become metallic and superconducting. For the same reasons one could expect that the M layers next to I-M interfaces to lose oxygen from $CuO_2$ planes, thus becoming disordered, localized and insulating.

Further analysis of the transport data in I-M case along these lines shows that for a 1.5-UC-thick top M layer the R(T) dependence shows a minimum around 75 K and a ratio R(300 K)/R(4 K) close to unity, nearly the same as what is observed in underdoped LSCO crystals with x≈0.03-0.04 as disclosed, for example, by Y. Ando, et al. in "*Mobility of the Doped Holes and the Antiferromagnetic Correlations in Underdoped High-$T_c$ Cuprates*," Phys. Rev. Lett. 87, 017001 (2001) which is incorporated by reference. The resistivity in such crystals is ρ≈1 mΩ·cm; if it were the same in our underdoped layer, its thickness should be d≈2 nm (~1.5 UC). These results also indicate that in I-M structures with a very thin top M layer the latter is actually underdoped and disordered. The normal structure of the M layer is recovered, however, after a critical thickness of 2 to 3 UC.

Another possible cause for interfacial HTS is electronic reconstruction. Experimental data disclosed by S. Smadici, et al. (hereinafter "Smadici") in "*Hole Delocalization in Superconducting $La_2CuO_4$—$La_{1.64}Sr_{0.36}CuO_4$*," (preprint submitted to Phys. Rev. Lett.) shows that charge depletion or accumulation is substantial across M-I and I-M interfaces. On the other hand, it has been shown by I. Bozovic, et al. in "*No Mixing of Superconductivity and Anti-Ferromagnetism in a High-Critical-Temperature Superconductor*," Nature 422, 873 (2003) that such charge transfer is negligible when M is replaced by optimally doped LSCO. These findings are consistent with the doping dependence of the chemical potential in LSCO inferred from X-ray photoemission data disclosed by A. Ino, et al. (hereinafter "Ino") in "*Chemical potential shift in overdosed and underdoped $La_{2-x}Sr_xCuO_4$*," Phys. Rev. Lett. 79, 2101 (1997). The above-referenced article to Bozovic along with both Smadici and Ino are incorporated by reference as if fully set forth in this specification.

We consider also charge accumulation depletion due to a difference in the chemical potential. X-ray photoemission data of K. Fujita, et al. (hereinafter "Fujita") in "*Effect of Disorder Outside the $CuO_2$ Planes on $T_c$ of Copper Oxide Superconductors*," Phys. Rev. Lett. 95, 097006 (2005) indicate that there is essentially no change in the chemical potential (μ) up to the optimal doping in LSCO, i.e. dμ/dx<0.2 eV/hole for x≦0.16. However, at higher doping, a larger decrease (dμ/dx≈1.5 eV/hole) is observed. These results are consistent with the absence of a supercurrent when I layers are sandwiched between blocks of optimally doped LSCO, implying chemically abrupt interfaces and no inter-diffusion, while allowing for charge accumulation/depletion in . . . -M-I-M-I- . . . superlattices. Direct evidence for this effect has recently been reported by Smadici which also addresses quantitatively the issue of inter-diffusion and the results agree very well with TEM data.

Assuming a carrier density n≈4.8×10$^{21}$ cm$^{-3}$ for M layers, $\epsilon_r$~30 (from C. Y. Chen, et al. in "*Frequency and Magnetic-Field Dependence of the Dielectric Constant and Conductivity of $La_2CuO_{4+y}$*," Phys. Rev. B 43, 392 (1991)) for the dielectric permittivity of I and Δμ~0.5 eV (from Ino)), the formula for the accumulation layer at a metal-semiconductor interface, $\Delta\mu = en l^2 / 2\epsilon_r\epsilon_0$ (from S. M. Sze in "*Physics of Semiconductor Devices*," John Wiley & Sons, 1969) gives a value l≈0.6 nm, or about 0.5 UC. Interestingly, this crude estimate falls within the range of the characteristic length for interface superconductivity determined from FIGS. 3A-C and is in quantitative agreement with the screening length at the M-I interface determined by Smadici.

It is conceivable that structural aspects such as (absence of) disorder play a crucial role in the relative $T_c$ enhancement in M-S bilayers. The doping without disorder scenario of Smadici may have been realized by introducing carriers via charge transfer and by (ordered) interstitial oxygen pinned near the interface. Another possibility is that the "intrinsic" $T_c$ in LSCO would be even higher were it not for some competing instability and that this other order parameter is suppressed in bilayers via long-range strain and/or electrostatic effects. Finally, an interesting possibility is that pairing and/or coherence of electrons in one layer is enabled or enhanced by interactions originating in the neighboring layer as disclosed by V. L. Ginsburg in "*On interface superconductivity*," Phys. Lett. 13, 101 (1964) and S. A. Kivelson, et al. in "*Making high $T_c$ higher: a theoretical proposal*," Physica B 318, 61 (2002) which are both incorporated by reference.

Electrical measurements suggest that in M-S bilayers the enhanced $T_c$~50 K is confined to the interface and is tied to the way the interface affects incorporation of interstitial oxygen. The $T_c$=50 K plateau is reached with a 3 nm thick top S layer (see FIG. 3C) and it does not change with further increases in the thickness of the top layer. This suggests that this is the characteristic length scale for the enhanced superconductivity. Clear evidence that in M-S bilayers interstitial oxygen acts differently than in single-phase films was provided by I. Bozovic, et al. in "*Epitaxial Strain and Superconductivity in $La_{2-x}Sr_xCuO_4$ Thin Films*," Phys. Rev. Lett. 89, 107001 (2002) which discloses that experiments involving vacuum annealing of a 40 UC thick S film at T~200° C. for 30 min converts this compound from a superconducting metal into a strong insulator. This is incorporated by reference as if fully set forth in this specification. In contrast, in an M-S bilayer the critical temperature drops by only $\Delta T_c$≈2-3 K even if it is twice as thin and was annealed at higher temperatures (250° C.) for four times longer (120 min). Interstitial oxygen in $La_2CuO_{4+\delta}$ is mobile and, particularly for very thin films, it diffuses out of the sample over a time scale of hours or days. Interface trapping of oxygen could be the reason for the remarkable resilience and stability (over a time scale of years) of interfacial superconductivity in the M-S bilayers.

It is to be understood that while the above description focuses on interfacial superconductivity in LSCO layers, the scope of the present invention is not confined solely to this material system. The key aspect is the concept of charge depletion and accumulation across the interface between two materials which may not themselves be superconducting. This appears to be caused by differences in the chemical potential of the two layers forming the interface. Consequently, any material system which exhibits this behavior is a candidate for the occurrence of high-temperature interfacial superconductivity provided, of course, that the electronic structure permits the necessary pairing mechanism. This may include, but is not limited to, other cuprates such as the YBCO, $DyBa_2Cu_3O_7$, $PrBa_2Cu_3O_7$, $Bi_2Sr_2CuO_8$ (Bi-2201), $Bi_2Sr_2CaCu_2O_8$ (Bi-2212), $Bi_2Sr_2Ca_2Cu_3O_8$ (Bi-2223), and $BiSr_2Ca_7Cu_8O_8$ (Bi-1278) families of superconductors as well as Tl- and Hg-based cuprates, the infinite-layer compounds of the formula (M, M')CuO2 where M, M'=Ca, Sr, or Ba with possible additions of La, Pb, other rare earth elements, etc. By varying the doping concentration (as was performed for LSCO) to obtain single-phase layers with the desired properties, a superconducting interface can be formed between adjacent layers which are not themselves superconducting. Alternatively, a superconducting layer can be formed adjacent to a layer which is not superconducting (e.g., a metallic layer) to produce an interfacial layer with a $T_c$ higher than that of the bulk superconducting layer. This approach shows great promise for driving $T_c$ to still higher temperatures.

An embodiment describing the experimental procedure followed to form an M-I superconducting interface will now be described in detail. The embodiment is merely exemplary and is used to describe the best mode of practicing the invention. It is to be understood that there are many possible variations which do not deviate from the spirit and scope of the present invention.

II. EXEMPLARY EMBODIMENT

A exemplary method of forming an embodiment of the superconducting interface will now be described in detail. A substrate of LSAO is initially cleaned and prepared ex-situ by ultrasonication in acetone and isopropyl alcohol followed by a 2 min rinse in distilled water. The substrate is then loaded into the ALL-MBE chamber having a background pressure in the $10^{-11}$ Torr range by means of a suitable load-lock and ultrahigh vacuum sample transfer system. The LSAO surface is annealed at 650° C. prior to film growth for 10 to 15 min to desorb surface impurities and produce an atomically smooth surface for film growth as determined by in-situ RHEED and TOF-ISARS analyses. Within the ALL-MBE system, La, Sr, and Cu sources have been pre-calibrated to growth rates which are accurate to within 1.0% of a single atomic layer. Oxygenation is supplied by a pure ozone gas source from a custom-built ozone distillation system.

Film growth proceeds by gradually increasing the substrate temperature to the desired deposition temperature of 650° C. A metallic layer comprising $La_{1.55}Sr_{0.45}CuO_4$ is initially deposited by alternatively opening and closing the La, Sr, and Cu shutters at the appropriate time intervals which depend on the actual deposition rates of the sources while maintaining a background $O_3$ pressure of $6 \times 10^{-6}$ Torr. Deposition continues until the film thickness reaches N UCs where N=1, 2, ... 100. This is followed by deposition of a M UC-thick insulating layer of $La_2CuO_4$ where M=1, 2, ..., 100. The substrate is then cooled to room temperature and removed from the deposition chamber. R(T) measurements of the resulting bilayer structure exhibit $T_c > 30$ K whereas XRD analyses reveal a M-I bilayer which is fully strained and commensurate with the substrate. HR-XTEM images and EELS measurements show that the superconducting interface is locally atomically abrupt with no measurable Sr interdiffusion across the interface.

III. ELECTRONIC DEVICES

An interfacial layer which superconducts at high temperature may find a wide range of prospective applications. There has been significant interest in the development of superconducting electronics due to the potential for devices with extraordinarily high density, high speed, and very low power consumption. The primary beneficiaries include, but are not limited to incorporation in two- and/or three-terminal devices, as interconnect wiring in microelectronic circuitry, and in various types of hybrid devices. The general principles governing incorporation of an interfacial superconducting layer into such devices are described in the following sections along with the accompanying exemplary embodiments.

A. Two-Terminal Devices

As its name suggests, a two-terminal device is generally defined as a device having dual electrodes. Two-terminal devices based on thin superconducting films generally operate based on the Josephson effect. These include, for example, magnetometers based on a superconducting quantum interference device (SQUID) with one or two Josephson junctions and conventional SIS or SNS tunnel junctions. A Josephson junction may comprise, for example, a M-I-M structure wherein a thin insulating layer separates two metal layers. The M-I and I-M interfaces are superconducting, thereby enabling one to produce a SIS tunnel junction. A metallic material such as gold (Au), copper (Cu), aluminum (Al), or any suitable transition metal may be formed at the terminal portions of the devices to make electrical contact.

Figure 12:
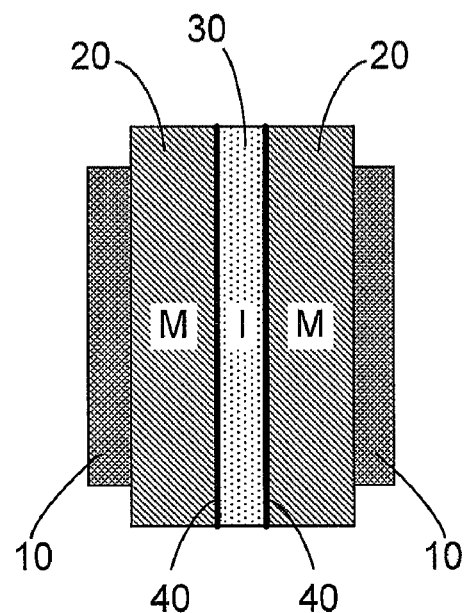
FIG. 12 shows an exemplary two-terminal SIS tunnel junction fabricated from a M-I-M layered structure.

An example of a two-terminal device formed from a M-I-M trilayer is shown in FIG. 12. The M layers (20) may be overdoped LSCO whereas the thin I layer (30) may be LCO or underdoped LSCO. Ultrathin superconducting layers (40) are formed at the M-I and I-M interfaces. Electrical contact is made by means of metal electrodes (10) formed on each M layer (20). A SIS tunnel junction is formed from the resulting superconducting interface-insulating layer-superconducting interface structure. The entire device may be formed on a substrate using standard semiconductor photolithography processes. In another embodiment the M-I-M structure may have an insulating layer of a different material interspersed between M-I and I-M layers to form a M-I-insulator-I-M layered structure.

The example provided above is only one embodiment of a two-terminal device. The enabling material is the HTS interface which provides a stable and ultrathin superconducting layer. Consequently any two-terminal device which requires a thin superconducting layer may incorporate the superconducting interface as described in this specification. Various two-terminal devices which may incorporate a superconducting interface and their method of manufacture are described, for example, in U.S. Pat. Nos. 5,106,823; 5,171,732; 5,378,683; and 5,399,881 each of which is incorporated by reference as if fully set forth in this specification.

B. Three-Terminal Devices

Conventional semiconductor integrated circuits include three-terminal devices in which current flow through a channel between two terminals (source and drain electrodes) may be controlled by applying a voltage to a third terminal (the gate electrode). Such a device is commonly known as a field-effect transistor (FET). By utilizing a superconducting interface as the channel material, it may be possible to switch the transistor between a superconducting and resistive state by applying a voltage to the third terminal. Such a device is termed a SuFET for short. Successful fabrication of SuFETs has been elusive due primarily to the difficulty of fabricating sufficiently stable and ultrathin layers which superconduct at high temperatures. The present invention solves these problems by providing a robust method for depositing highly stable high temperature superconducting interfacial layers which are confined to an ultrathin region at the interface between adjacent layers.

A SuFET is generally comprised of a superconducting interface with opposing source and drain contacts, a gate insulator, and a gate electrode. Operation generally occurs near $T_c$ with a gate voltage being applied to, for example, induce a transition from a superconducting state to an insulating state. Removal of the gate voltage results in a transition from the insulating state back to the superconducting state. The interfacial superconducting layer may itself be fabricated by deposition of adjacent layers upon a suitable substrate and patterning the layers using photolithography techniques standard to the semiconductor industry. Fabrication of various types of SuFETs and their operation are also described, for example, in U.S. Pat. Nos. 5,380,704; 5,422,336; 5,686,745; 5,717,222; and 6,365,913 which, along with the references cited therein, are incorporated by reference as if fully set forth in this specification.

Figure 13:
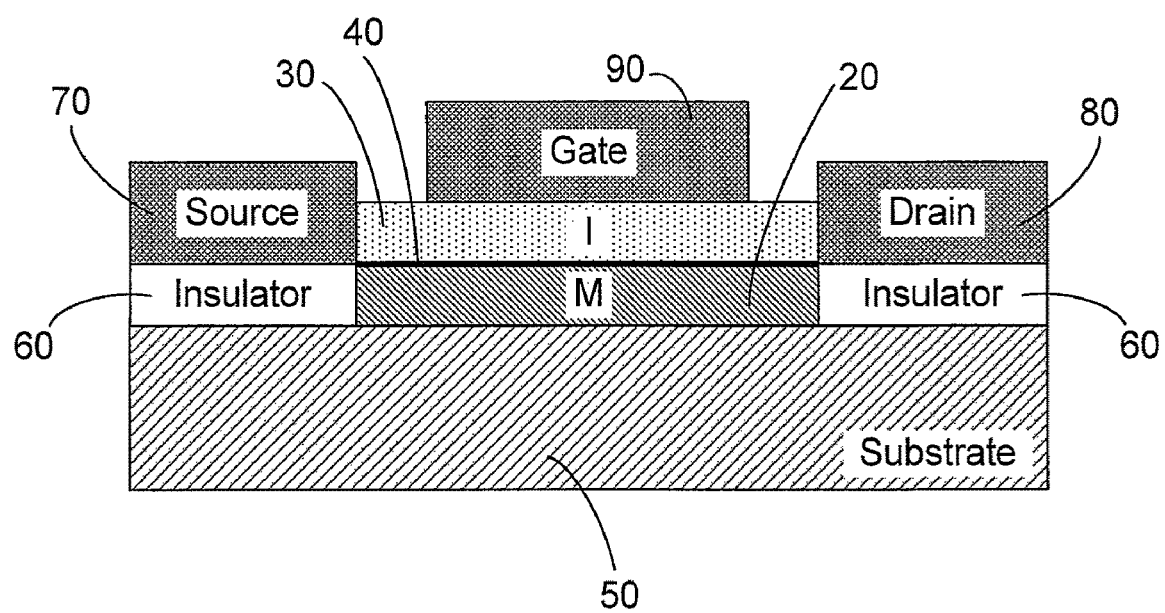
FIG. 13 shows an exemplary three-terminal SuFET fabricated based upon a M-I bilayer.

An exemplary embodiment of a SuFET fabricated based on a M-I bilayer is illustrated in FIG. 13. The SuFET is formed on any suitable substrate (50) which may be, for example, LSAO or STO. A thin film of an insulating material (60) is initially deposited and patterned as shown in FIG. 13. This is followed by formation of a metal layer (20) such as overdoped LSCO in the region between the insulator layers (60). This may be accomplished, for example, by using lift-off or masking techniques which are well-known in the art. The superconducting interface (40) is formed by depositing an insulating layer (30) of LCO or underdoped LSCO onto the metal layer (20) to form a M-I bilayer structure. The insulating layer (30) may itself be used as the gate dielectric or another insulator with a different dielectric constant may be used. The three-terminal SuFET is completed by depositing and patterning suitable source (70), drain (80), and gate (90) electrodes using any suitable metallic material such as Cu, Au, Al, or any other appropriate transition metal. The device is designed such that the insulator layers (60) electrically isolate the source (70) and drain (80) from the underlying metal layer (20) while still permitting electrical contact with the superconducting interface (40).

It is to be understood that the SuFET shown in FIG. 13 is merely exemplary of many possible designs which may incorporate the superconducting interfacial layer of the present invention. For example, the SuFET may have an inverted structure as disclosed, for example, in U.S. Pat. Nos. 5,240,906 and 5,382,565. There also are a plurality of methods which may be employed to make electrical contact to the superconducting interface to enable electrical current to flow between the source and drain. The general operative concept of two- and three-terminal devices is well-known in the art and will be omitted from this specification.

C. Hybrid Devices and Current Transport

The interfacial superconducting layers described in this specification may find applications in virtually any type of electronic device which requires incorporation of a thin HTS layer. Some examples include applications related to quantum computers (U.S. Pat. No. 6,649,929), hybrid semiconductor-superconductor devices (U.S. Pat. Nos. 5,138,401; 5,326,988; and 5,455,451), in a JoFET (U.S. Pat. No. 6,111,268) as interconnect wiring between devices (U.S. Pat. No. 4,837,609), and as a barrier layer for integrated circuit interconnects (U.S. Pat. No. 6,518,648). Devices which utilize a superlattice of superconducting interfacial layers (e.g., . . . -M-I-M-I-M- . . . ) may also be fabricated. Each of the aforementioned and the references listed therein are hereby incorporated by reference. This list is not meant to be exhaustive and all-inclusive, but is meant to be representative of the type of devices which require a thin superconducting layer. In each and every instance the thin superconducting layer may be replaced by the superconducting interface disclosed in this specification.

It will be appreciated by persons skilled in the art that the present invention is not limited to what has been particularly shown and described above. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. The alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent.

The invention claimed is:

1. A superconducting interfacial layer formed by charge depletion and accumulation across an interface between non-superconducting materials with differing chemical potentials in which the interface is superconducting,
wherein the superconducting interface is formed between two cuprate layers, one of which behaves as an electrical insulator and the other as an electrical conductor.

2. The superconducting interface of claim 1 wherein the superconducting interfacial layer thickness is $\leq 2$ UCs.

3. The superconducting interface of claim 2 wherein the interface is atomically abrupt.

4. The superconducting interface of claim 3 wherein $T_c>30$ K.

5. The superconducting interface of claim 4 wherein the metal and insulator are cuprates.

6. The superconducting interface of claim 5 wherein the metal is overdoped $La_{2-x}Sr_xCuO_4$.

7. The superconducting interface of claim 6 wherein the overdoped $La_{2-x}Sr_xCuO_4$ is a thin film.

8. The superconducting interface of claim 7 wherein the film thickness is $\leq 5$ UCs.

9. The superconducting interface of claim 7 wherein $x>0.25$.

10. The superconducting interface of claim 5 wherein the insulator is underdoped $La_{2-x}Sr_xCuO_4$ or $La_2CuO_4$.

11. The superconducting interface of claim 10 wherein the underdoped $La_{2-x}Sr_xCuO_4$ or $La_2CuO_4$ is a thin film.

12. The superconducting interface of claim 11 wherein the film thickness is $\leq 5$ UCs.

13. The superconducting interface of claim 11 wherein $x<0.06$.

14. The superconducting interface of claim 1 wherein the metal and insulator are thin films sequentially formed on a substrate.

15. The superconducting interface of claim 14 wherein the insulator is formed on top of the metal.

16. The superconducting interface of claim 14 wherein the metal is formed on top of the insulator.

17. The superconducting interface of claim 14 wherein the substrate comprises $LaSrAlO_4$, $SrTiO_3$, or $(La_{0.29}, Sr_{0.71})(Al_{0.65},Ta_{0.35})O_3$.

18. A superconducting interfacial layer formed by charge depletion and accumulation across an interface between non-superconducting materials with differing chemical potentials in which the interface is superconducting,
wherein the superconducting interface is formed between a metal and an insulator, and wherein the metal is $La_{2-x}Sr_xCuO_4$ with $x>0.25$ and the insulator is $La_{2-x}Sr_xCuO_4$ with $x<0.06$ or $La_2CuO_4$.

19. A layered structure comprising a plurality of the superconducting interfaces according to claim 1.

20. A layered structure comprising a plurality of superconducting interfaces formed between at least two cuprate layers, at least one behaving as an electrical conductor and at least one behaving as a superconductor.

21. A superconducting interfacial layer formed by charge depletion and accumulation across an interface between non-superconducting materials with differing chemical potentials in which the interface is superconducting,
wherein the superconducting interface is formed between a metal and an insulator, and wherein the superconductor layer is $La_{2-x}Sr_xCuO_4$ or $La_2CuO_{4+\delta}$.

22. The layered structure of claim 20, or 21 wherein $T_c > 50$ K.

23. The layered structure of claim 21 wherein $0.06 \leq x \leq 0.25$.

24. The layered structure of claim 21 wherein the layer thicknesses is >2 UC.

25. The layered structure of claim 21 wherein the interfaces are atomically abrupt.

26. An electronic device comprising a superconducting interface which is formed according to claim 1, 19, or 20.

27. The electronic device of claim 26 wherein the electronic device is a two-terminal electronic device.

28. The electronic device of claim 27 wherein the two-terminal electronic device comprises a Josephson junction.

29. The electronic device of claim 26 wherein the electronic device is a three-terminal electronic device.

30. The electronic device of claim 29 wherein the three-terminal electronic device comprises a SuFET.

31. The electronic device of claim 26 comprising said superconducting interface as interconnect wiring.

32. A method of forming a superconducting interface comprising: depositing a metal layer; and depositing an insulator layer onto the metal layer.

33. The method of claim 32 wherein the metal layer is deposited onto a substrate.

34. The method of claim 32 wherein the layers are deposited by ALL-MBE.

35. A method of forming a superconducting interface comprising:
depositing an insulator layer; and depositing a metal layer onto the insulator layer.

36. The method of claim 35 wherein the insulator layer is deposited onto a substrate.

37. The method of claim 35 wherein the layers are deposited by ALL-MBE.

* * * * *